United States Patent
Suzuki et al.

(10) Patent No.: US 6,529,438 B1
(45) Date of Patent: Mar. 4, 2003

(54) SEMICONDUCTOR MEMORY DEVICE IMPLEMENTED WITH A TEST CIRCUIT

(75) Inventors: Yoichi Suzuki, Kanagawa-ken (JP); Akihiro Mishima, Kanagawa-ken (JP); Mitsuhiko Kosakai, Kanagawa-ken (JP); Makoto Segawa, Kanagawa-ken (JP); Yasuo Naruke, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 09/722,195

(22) Filed: Nov. 22, 2000

(30) Foreign Application Priority Data

Nov. 25, 1999 (JP) .............................. 11-334971
Sep. 21, 2000 (JP) ..................... 2000-287191

(51) Int. Cl.$^7$ ................................. G11C 8/00
(52) U.S. Cl. ................. 365/230.06; 365/201; 365/226; 365/225.7
(58) Field of Search .............. 365/230.06, 201, 365/226, 225.7

(56) References Cited

U.S. PATENT DOCUMENTS 5,936,910 A  *  8/1999  Hashimoto .................... 365/201
6,041,002 A  *  3/2000  Maejima ..................... 365/200
6,333,517 B1 * 12/2001  Tamaki ....................... 257/368

* cited by examiner

*Primary Examiner*—Richard Elms
*Assistant Examiner*—Tuan T. Nguyen
(74) *Attorney, Agent, or Firm*—Hogan & Hartson LLP

(57) ABSTRACT

An improved semiconductor memory device capable of easily detecting the location of a defective bit line and a defective memory cell as a leakage current path for a short time is provided. A region flowing a leakage current no smaller than a predetermined value is determined by detecting one of a first large region and a remaining second large region, either of said first and second large regions being selected by simultaneously selecting a predetermined number of said column selection lines. Then, a region flowing a leakage current no smaller than a predetermined value is determined by detecting one of a first small region and a remaining second small region, said first and second small regions constituting said one of the first and second large regions, either of said first and second small regions being selected by simultaneously selecting a predetermined number of said column selection lines. For this purpose, an address signal output control circuit is provided within the semiconductor memory device. The address signal output control circuit is supplied with an address output control signal as externally given as a control signal for the purpose of selecting said row selection line by taking control of said row addressing signal in order to perform the control process as described above.

15 Claims, 19 Drawing Sheets

SEMICONDUCTOR MEMORY DEVICE IMPLEMENTED WITH A TEST CIRCUIT

CROSS REFERENCE TO RELATED APPLICATIONS

The subject application is related to subject matter disclosed in the Japanese Patent Application No. Hei 11-334971 filed in Nov. 25, 1999 and the Japanese Patent Application No. Hei 2000-287191 filed in Sep. 21, 2000 in Japan, to which the subject application claims priority under the Paris Convention and which is incorporated by reference herein.

BACKGROUND OF THE INVENTION

1. Field of the Invention

The present invention is related to a semiconductor memory device such as a static random access memory, and more particularly related to a semiconductor memory device implemented with a test circuit.

2. Prior Art

In the recent years, the increase in the storage capacity and the improvement of the power saving structure on the standby mode of semiconductor memory devices such as the static random access memory have been advanced. The occurrence frequency of defective bit locations tends to increase as the storage capacity increases so that, in the test process, defective memory cells are replaced by redundancy memory cells in accordance with the redundancy circuitry technique in order to recover the semiconductor memory device.

It is sometimes the case, however, that there is a memory call(s) through which a leakage current exceeding the allowable value is passed while the static random access memory including the defective memory cell normally operates without a problematic function. If there is such a memory cell, the consumption current in the standby mode is increased which decreases the device yield.

In accordance with the conventional semiconductor memory device as illustrated in FIG. 1, the location of a defective memory cell is detected as a path of a leakage current by a test circuit provided within the semiconductor memory device in order to cut off the leakage path via the defective memory by selectively melting and disconnecting a laser fuse through which the defective memory is connected to the power terminal so that the defective memory is replaced by a redundancy cells.

More specifically explaining, in the case of the semiconductor memory device as illustrated in FIG. 1, a "H" level operation mode switching signal S6 is externally inputted to an external input circuit 92 through an external input terminal 91. By this configuration, the output signal S4 and the output signal S5 of the external input circuit 92 become at the "L" level and at the "H" level respectively. An n-type transistor Q2 receives at the gate thereof the output signal S5 being pulled up to the "H" level and is then turned on, and therefore the output signal S3 of a row address decoder 9 is transferred to one terminal of an NOR gate circuit 93 as the output signal S2.

By this configuration, the output signal S3 of the row address decoder 96 is pulled up to the "H" level while, although not shown in the figure, the remaining output signals of the row address decoder 96 to the remaining lines (not shown in the figure) is pulled down to the "L" level. The output signal S4 at the "L" level of the external input circuit 92 is input to the other input terminal of the NOR gate circuit 93 so that the output signal S1 at the "H" level is input to the gate of the n-type transistor Q1, which is then turned off. By this configuration, the common electric power source line g1 is separated from the electric power source, and therefore the memory cells M11 to M1n are no longer supplied with electric energy while the remaining common electric power source lines (not shown in the figure) are maintained connected to the electric power source to supply the electric power to the remaining memory cells.

Furthermore, the output signal S4 at the "L" level is input to the gate of the n-type transistor Q5 while the output signal S5 at the "H" level is input to the gate of the n-type transistor Q4 and the gate of the p-type MOS transistor. As a result, the n-type transistor Q5 and the p-type MOS transistor are turned off while the n-type transistor Q4 is turned on so that the word line w1 is grounded in order to be separated from the output signal S3 of the row address decoder. By this configuration, no current is passed through the memory cells M11 to M1m while the remaining memory cells are supplied with electric current.

It is determined, by selecting the respective lines in sequence and measuring the leakage current value for each selection in this manner, that a defective memory cell is included in the line being selected when the leakage current value is no lower than the allowable value. The defective line is then replaced with a redundancy line prepared in advance by melting the fuse F1 connected to that line to disconnect the common electric power source line g1 from the electric power source for cutting off the leakage current path.

The location of the memory cell as a leakage current path can be easily detected in this manner.

However, since recent semiconductor memory devices have been designed with large storage capacities, it is known that the memory cells of the memory cell arrays 50 are grouped into a plurality of blocks (l) to (n) in which the memory cells are arranged in matrices as illustrated in FIG. 2.

A plurality of row address decoders 52 are located for each two cells while a row selection line 53 is extended from each row address decoder 52. The row address decoder 52 serves to activate one of the row selection lines 53 as selected in accordance with the row addressing signal AIN which is input through an address decoder 60. There are provided, at a plurality of ends of the blocks, block selection circuits 70 from which are extended block selection lines 55, and word line selection circuits 56 receiving input signals from the row selection lines 53 and the block selection lines 55.

Also, each pair of the memory cells 51 are located symmetrically in the vertical direction and commonly supplied with the electric power source through a common electric power source line VL which is located in parallel with the row selection line 53.

In a normal operation mode, the memory cells 51 can be selected by selecting one of a plurality of the row selection lines 53 and one of a plurality of the block selection lines 55 in accordance with a desired address AIN and a desired address signal BIN in order to activate a desired one of the word lines 54 connected to the row selection line 53 and the block selection line 55 as selected. Data as selected can be read from the memory cells 51 by means of a read/write circuit 80 and output through an I/O terminal while desired data can be written to the memory cell 51 by means of a read/write circuit 80 through the I/O terminal.

When the semiconductor memory device is on the standby mode, all the word lines 54 are inactivated under the control of an internal circuit in response to an external signal as input.

Furthermore, in the case of recent semiconductor memory devices having been designed with large storage capacities, there are problems relating not only to the memory cell but also to the leakage current passing through a bit line, resulting in decrease of the device yield. Taking this point into consideration, when a defective function originating from a leakage current path through a bit line is recovered by the redundancy circuitry technique, the fuse elements as inserted to the electric power source connected to the bit line is disconnected by melting in order to replace the defective bit line by a redundancy cell as illustrated in FIG. 3 showing an exemplary conventional semiconductor memory device of this kind.

The conventional semiconductor memory device as illustrated in FIG. 3 is composed of a memory cell array consisting of a number of memory cells 100 arranged in the form of a matrix, control terminals (CE,WE,OE), internal circuits provided for the control terminals (a CE buffer, a WE buffer, an OE buffer), address terminals (an AINR terminal, an AINC terminal), internal circuit provided for the address terminals (row address decoders 120, a row address buffer 121, column switches 131, column address decoders 132, a column address buffer 133), I/O terminals for writing and reading data and internal circuit provided for the I/O terminals (a plurality of bit line load & pull-up & equalizer circuits 110, a data line pull-up & equalizer circuit 134, a sense amplifier & write buffer circuit 135.

Each bit line load & pull-up & equalizer circuit 110 is connected between each pair of the bit lines. A respective fuse 115 is connected between each bit line load & pull-up & equalizer circuit 110 and the power terminal VDD. The bit line load & pull-up & equalizer circuit 110 is composed of bit line load circuits 111 and 112 and bit line pull-up elements U1 and U2 and a bit line equalizer element E1. The bit line load & pull-up & equalizer circuit 110 is then activated or inactivated in accordance with the output signal φ1 of a bit line equalizer pull-up generation circuit 151. The data line pull-up & equalizer circuit 134 is composed of data line pull-up elements U3 and U4 and a bit line equalizer element E2. The data line pull-up & equalizer circuit 134 is then activated or inactivated in accordance with the output signal φ2 of the data line equalizer pull-up generation circuit 152.

The normal operation mode and the standby mode of the semiconductor memory device are implemented as follows.

In the normal operation mode, a predetermined word line and a predetermined column switch are selected in accordance with an address as given and therefore the memory cell as selected is activated to perform the read/write operation.

In the standby mode, a chip enable signal is externally input to a CE terminal in order to inactivate 811 the word lines W1 to Wm by the control operation of the internal circuit thereof. Also, all the column switches 131 become non-conductive by means of said chip enable signal. Furthermore, all thee bit line pairs B1, B1B . . . , Bn, BnB and the data lines D1 and D1B are fixed to the power potential VDD while the output signal φ1 of the bit line equalizer pull-up generation circuit 151 and the output signal φ2 of the data line equalizer pull-up generation circuit 152 are pulled to the "L" level.

However, there are following shortcomings in the case of the semiconductor memory device in accordance with the conventional technique as described above.

(1) In the semiconductor memory devices with large storage capacities as illustrated in FIG. 2, the location of a defective memory cell is detected as a path of a leakage current by the test process. There is a problem however not only that, while the time required for completing the test tends to be very long, but also that the test circuit as illustrated in FIG. 1 tends to occupy a substantial area resulting in the increased chip size.

(2) In the semiconductor memory devices as illustrated in FIG. 3, while the memory cells 100 serve to maintain data, the bit line pairs B1, B1B, . . . , Bn, BnB are fixed to the power potential VDD while the word lines W1 to Wm are fixed to the ground level by the control operation of the internal circuit thereof. In this case, however, there are sometimes formed a leakage current path P1 or P2. If the leakage current passed through the leakage current path P1 or P2 is sufficiently small, the redundancy circuitry technique is not applied to, while the normal read/write operation is not affected by the leakage current, and therefore the device yield is reduced when the consumption current on the standby mode exceeds the allowable value.

SUMMARY OF THE INVENTION

In brief, the above and other objects and advantages of the present invention are provided by a new and improved semiconductor memory device comprising:

a plurality of word lines each of which is connected to a predetermined number of memory cells in the row direction;

a plurality of common electric power source lines each of which is provided for each predetermined number of rows in order to make connection with the current paths of the memory cells on said each predetermined number of rows in a row direction;

a plurality of row selection lines connected respectively to said respective word lines for the purpose of selecting a row;

row address decoders for selecting said row selection lines; and a selection circuit connected between said common electric power source lines and an electric power source respectively for selecting one of said common electric power source lines by means of said row address decoders in order to connect the common electric power source line as selected with the electric power source and disconnect the remaining common electric power source lines from the electric power source in the case that switching to a test mode is indicated by an operation mode switching signal which is used to switch between a normal operation mode and a test mode, and for connecting all of said common electric power source lines with the electric power source in the case that said the operation mode switching signal indicate switching to the normal operation mode.

In a preferred embodiment, further improvement resides in that a fuse is provided between the electric power source and a respective one of said common electric power source lines.

In accordance with a further aspect of the present invention, the above and other objects and advantages of the present invention are provided by a new and improved semiconductor memory device comprising:

a plurality of word lines connected to a predetermined number of memory cells in a row direction;

a plurality of common electric power source lines each of which is provided for each predetermined number of rows in order to make connection with the current paths of the memory cells on said each predetermined number of rows in the row direction;

a plurality of row selection lines connected respectively to said respective word lines for the purpose of selecting a row;

row address decoders for selecting said row selection lines; and a test circuit for connecting an electric power source, by selecting one of said plurality of the row selection lines, with said common electric power source line arranged corresponding to the row selection line as selected and for disconnecting the remaining common electric power source lines from the electric power source.

In a preferred embodiment, further improvement resides in that a fuse is provided between the electric power source and a respective one of said common electric power source lines.

In accordance with a further aspect of the present invention, the above and other objects and advantages of the present invention are provided by a new and improved semiconductor memory device comprising:

a memory cell array in which memory cells are arranged in the form of a matrix which is divided into a plurality of blocks;

a plurality of word lines provided within said memory cell array, each of said word lines being connected to a same number of memory cells in a row direction;

a word line selection circuit having input terminals connected to a row selection line for selecting a row and a block selection line for selecting a block for selecting a predetermined word line among from the plurality of said word lines;

a plurality of common electric power source lines each of which is provided for each predetermined number of rows in order to make connection with the current paths of the memory cells on said each predetermined number of rows in the row direction;

row address decoders for outputting a selection signal on the basis of a row addressing signal required for selecting said row selection lines;

a selection circuit connected between said common electric power source lines and an electric power source respectively and receiving an operation mode switching signal which is used to switch between a normal operation mode and a test mode and said selection signal as given from said row address decoders for selecting one of said common electric power source lines by said selection signal in order to connect the common electric power source line as selected with the electric power source and disconnect the remaining common electric power source lines from the electric power source in the case that switching to the test mode is indicated by said operation mode switching signal, and for connecting all of said common electric power source lines with the electric power source in the case that said the operation mode switching signal indicate switching to the normal operation mode; and an address signal output control circuit for controlling the supply of a row addressing signal to said row address decoders on the basis of an address output control signal as externally given for the purpose of determining a defective cell in the case that switching to the rest mode is indicated by said operation mode switching signal.

In a preferred embodiment, further improvement resides in that the determination of a defective cell is performed by:

determining, as a region flowing a leakage current no smaller than a predetermined value, one of a first large region and a remaining second large region, either of said first and second large regions being selected by simultaneously selecting a predetermined number of said row selection lines;

determining, as a region flowing a leakage current no smaller than a predetermined value, one of a first small region and a remaining second small region, said first and second small regions constituting said one of the first and second large regions, either of said first and second small regions being selected by simultaneously selecting a predetermined number of said row selection lines, said address output control signal to be supplied to said address signal output control circuit is a control signal for selecting said row selection lines by controlling the output of said row addressing signal in order to perform the determination of a defective cell.

In a preferred embodiment, further improvement resides in that, while the number of said row address decoders is $2^n$.

In a preferred embodiment, further improvement resides in that said semiconductor memory device is provided with n address buffers each of which is provided with two output terminals for taking control of the output signal of the $2^n$ row address decoders, wherein n row addressing signals is input to the input terminal of said n address buffers, wherein said address signal output control circuit serves to output signals to one terminals of the output terminals of said n address buffers in the same phase as said row addressing signals and to output signals to the other terminals of the output terminals of said n address buffers in the opposite phase to said row addressing signals in the case that said the operation mode switching signal indicate switching to the normal operation mode, and serves to output signals to both the two output terminals of each of said n address buffers in the same phase as said row addressing signals in the case that said the operation mode switching signal indicate switching to the test operation mode.

In a preferred embodiment, further improvement resides in that said address output control signal is applied through existing I/O terminals which have provided for performing the read/write operation of user data.

In a preferred embodiment, further improvement resides in that said semiconductor memory device is provided with fuses provided between said common electric power source lines and the electric power source in order to separate a leakage current path when a defective cell is determined by the determination of a defective cell as recited.

In accordance with a further aspect of the present invention, the above and other objects and advantages of the present invention are provided by a new and improved semiconductor memory device comprising:

a memory cell array in which memory cells are arranged in the form of a matrix;

a plurality of word lines arranged within said memory cell array in the column direction of said memory cell, each of said word lines being connected to said memory cells respectively;

a plurality of bit lines arranged in the column direction of said memory cell array and connected to said memory cells;

a column selection circuit for selecting a desired bit line;

a test mode switching control circuit for disconnecting the respective bit lines from power source lines connected to one ends of said bit lines; and a test mode electric power supply circuit for supplying an electric power source to the bit lines as selected on the test mode.

In a preferred embodiment, further improvement resides in that said semiconductor memory device is provided with fuses provided between said bit lines and the common electric power source line connected to ends of those bit lines.

In accordance with a further aspect of the present invention, the above and other objects and advantages of the present invention are provided by a new and improved semiconductor memory device comprising:

a memory cell array in which memory cells are arranged in the form of a matrix;

a plurality of word lines arranged within said memory cell array in the column direction of said memory cell, each of said word lines being connected to one ends of the data transfer gates of said memory cells respectively;

column address decoders for outputting a column selection signal to the column selection line on the basis of a column address signal;

a column selection switch for selecting a desired bit line among from the plurality of said bit lines on the basis of said column selection signal;

a plurality of data lines connected to the plurality of said bit lines through said column selection switch;

a test mode switching control circuit for disconnecting the respective bit lines from power source lines connected to one ends of said bit lines in the case that switching to a test mode is indicated by an operation mode switching signal which is used to switch between a normal operation mode and the test mode; and a power terminal provided for leak test serving to supply an electric power source through said column selection switch to the bit lines as selected on the rest mode by means of said column selection switch for the purpose of detecting a leakage current through the bit lines.

In a preferred embodiment, further improvement resides in that said semiconductor memory device is provided with bit line equalizer circuits, bit line pull-up circuits and bit line load circuits connected respectively to one ends of said bit lines, wherein said operation mode switching control circuit serves to disconnect the electric power supply to said bit lines by inactivating said bit line equalizer circuits, said bit line pull-up circuits and said bit line load circuits.

In a preferred embodiment, further improvement resides in that said semiconductor memory device is provided with data line equalizer circuits and data line pull-up circuits, wherein said power terminal for leak test serving to supply an electric power source to said data line pull-up circuits and serving to supply the electric power source from said power terminal to the bit lines as selected on the test mode through said data line a pull-up circuits and said column selection switch for the purpose of detecting a leakage current through the bit lines.

In accordance with a further aspect of the present invention, the above and other objects and advantages of the present invention are provided by a new and improved semiconductor memory device comprising:

a memory cell array in which memory cells are arranged in the form of a matrix;

a plurality of word lines arranged within said memory cell array in the column direction of said memory cell, each of said word lines being connected to one ends of the data transfer gates of said memory cells respectively;

column address decoders for outputting a column selection signal to the column selection line on the basis of a column address signal;

a column selection switch for selecting a desired bit line among from the plurality of said bit lines on the basis of said column selection signal;

a plurality of data lines connected to the plurality of said bit lines through said column selection switch;

a test mode switching control circuit for cutting off the electric power supply through power source lines connected to one ends of said bit lines and through power source lines connected to a data lines in the case that switching to a test mode is indicated by an operation mode switching signal which is used to switch between a normal operation mode and the test mode;

a power terminal provided for leak rest through which an electric power source for test is supplied; and a bit line leakage load circuit provided between the power source provided for test and a ground and serves to supply said electric power source only to the bit lines as selected by means of said column selection switch on the test mode for the purpose of detecting the leakage current through the bit lines.

In a preferred embodiment, further improvement resides in that said semiconductor memory device is provided with an address signal output control circuit serves to take control of the column address signal to be supplied to said column address decoders on the basis of an address output control signal as externally given in order to perform the determination of a defective bit line in the case that said the operation mode switching signal indicate switching to the test mode.

In a preferred embodiment, further improvement resides in that the determination of a defective cell is performed by:

determining, as a region flowing a leakage current no smaller than a predetermined value, one of a first large region and a remaining second large region, either of said first and second large regions being selected by simultaneously selecting a predetermined number of said column selection lines;

determining, as a region flowing a leakage current no smaller than a predetermined value, one of a first small region and a remaining second small region, said first and second small regions constituting said one of the first and second large regions, either of said first and second small regions being selected by simultaneously selecting a predetermined number of said column selection lines, said address signal output control circuit serves to take control of said column address signal for selecting said column selection line in order to perform the determination of a defective bit line.

In a preferred embodiment, further improvement resides in that, while the number of said column address decoders is $2^n$ for outputting signals through $2^n$ column selection lines, said address signal output control circuit serves to select one of the $2^n$ column selection lines in the case that said the operation mode switching signal indicate switching to the normal operation mode and to select $2^n/2^n$ lines, (m=1,2, ..., n), of the $2^n$ column selection lines in the case that said the operation mode switching signal indicate switching to the test operation mode.

In a preferred embodiment, further improvement resides in that said semiconductor memory device is provided with n address buffers each of which is provided with two output terminals for taking control of the output signal of the $2^n$ column address decoders, wherein n column addressing signals is input to the input terminal of said n address buffers.

wherein said address signal output control circuit serves to output signals to one terminals of the output terminals of said n address buffers in the same phase as said column addressing signals and to output signals to the other terminals of the output terminals of said n address buffers in the opposite phase to said column addressing signals in the case that said the operation mode switching signal indicate switching to the normal operation mode, and serves to output signals to both the two output terminals of each of said n address buffers in the same phase as said column addressing signals in the case that said the operation mode switching signal indicate switching to the test operation mode.

In a preferred embodiment, further improvement resides in that said address output control signal is applied through existing I/O terminals which have provided for performing the read/write operation of user data.

In a preferred embodiment, further improvement resides in that said semiconductor memory device is provided with fuses provided between said bit lines and the common electric power source line connected to ends of those bit lines in order to break a leakage current path when a defective bit line is determined by the determination of a defective bit line as recited.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF EMBODIMENTS

Hereinbelow, several preferred embodiments in accordance with the present invention will be explained in conjunction with the accompanied drawings.

[First Embodiment]

Figure 5:
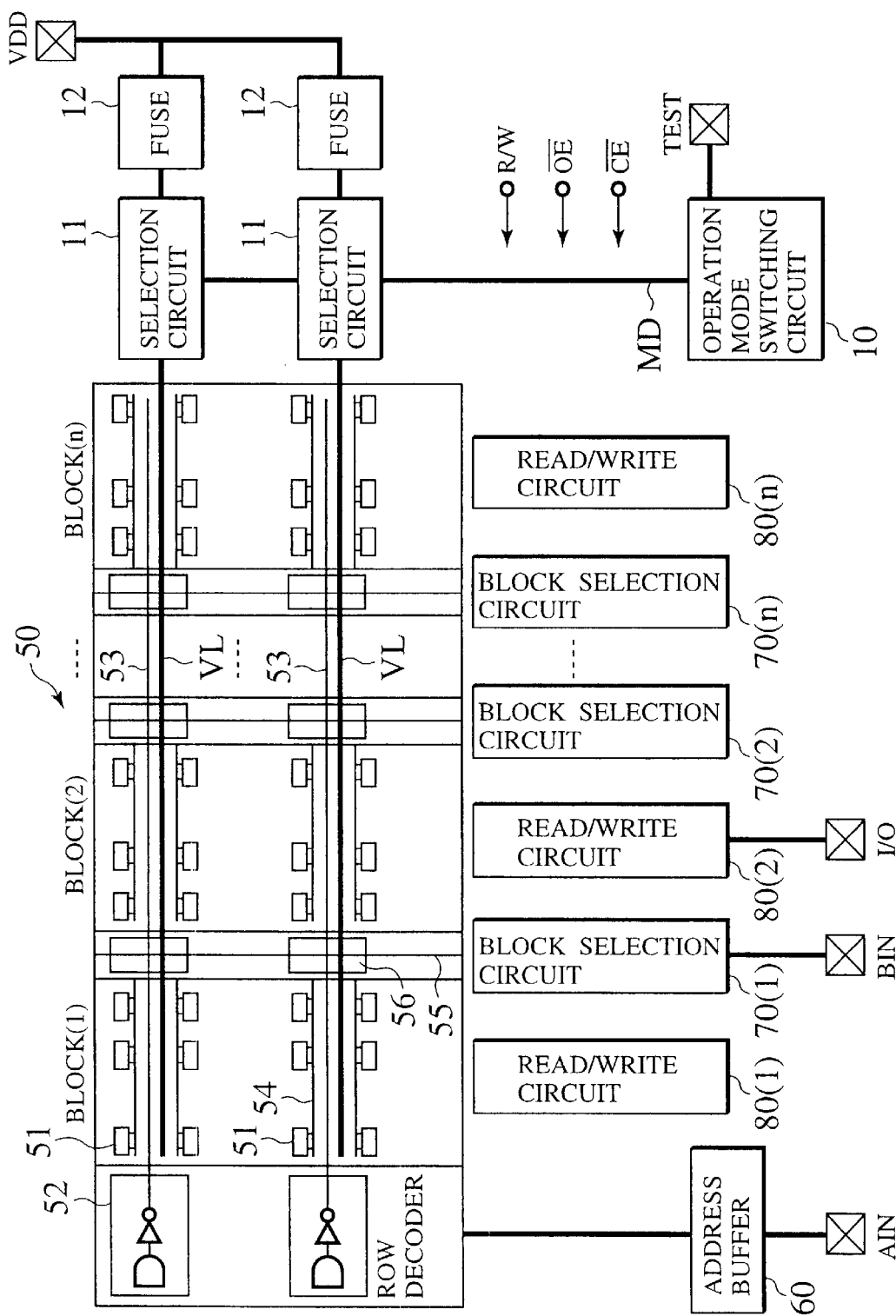
FIG. 5 is a block diagram showing the configuration of the semiconductor memory device in accordance with a first embodiment of the present invention.
Figure 6:
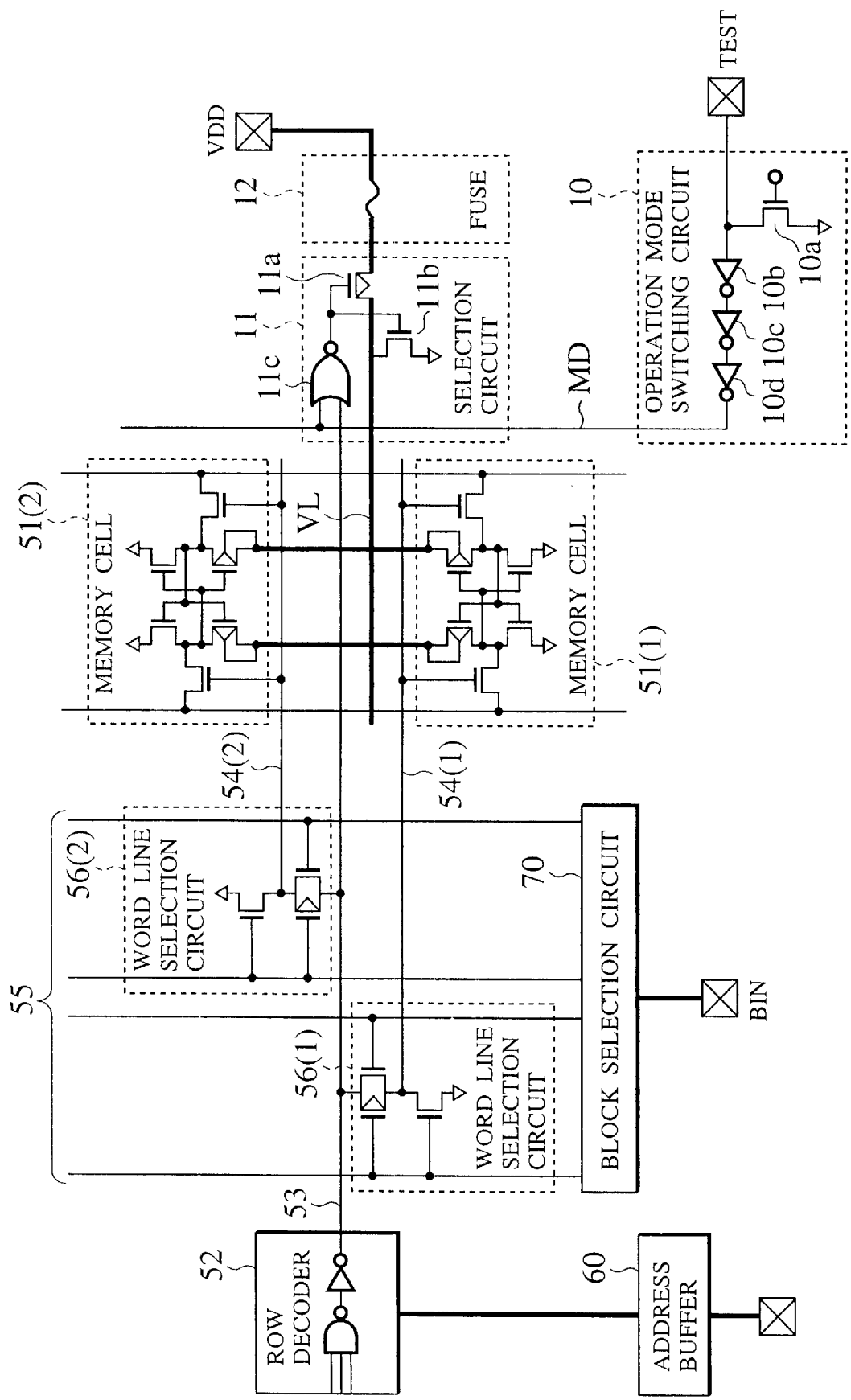
FIG. 6 is a circuit diagram showing the major elements of the semiconductor memory device as illustrated in FIG. 5.

FIG. 5 is a block diagram showing the configuration of the semiconductor memory device in accordance with the first embodiment of the present invention. FIG. 6 is a circuit diagram showing the major elements of the semiconductor memory device as illustrated in FIG. 5. In the figures, like references indicative of identical or functionally similar elements are given as illustrated in FIG. 14, and therefore redundant explanation is not repeated.

Figure 14:
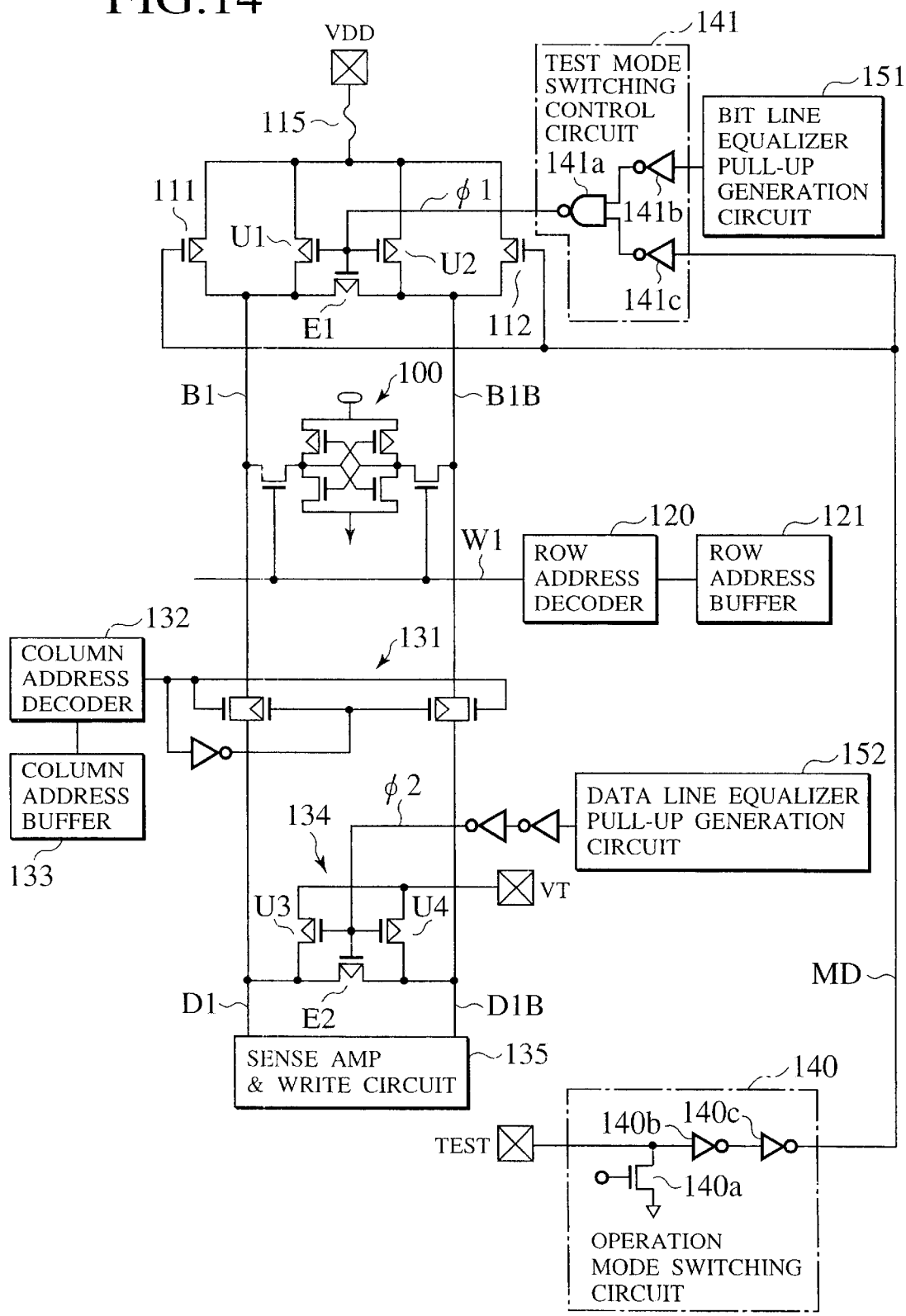
FIG. 14 is a circuit diagram showing a peripheral circuit provided for each bit line pair as the major elements of the semiconductor memory device as illustrated in FIG. 13.

As illustrated in FIG. 5, the semiconductor memory device is composed of a static random access memory RAM comprising, in the same manner as illustrated in FIG. 14, a memory cell array 50 divided into a plurality of blocks (1) to (n), control terminals (a chip enable signal /CE, a read/write signal R/W, an output enable signal /OE), internal circuits provided for the control terminals, address terminals (an AINR terminal, an AINC terminal), internal circuit provided for the address terminals (row address decoders 52 block select ion circuits 70(1) to 70(n) and so forth), I/O terminals for writing and reading data and internal circuit provided for the I/O terminals (reading and writing circuits 80(1) to 80(n)).

Each memory cell 51 is supplied with an electric power source through a common electric power source line VL arranged in the row direction. The selection circuit 11 is composed of a p-type MOS transistor 11a and an n-type MOS transistor 11b which are connected to the common electric power source line VL. The other terminal of the p-type MOS transistor 11a is connected to the power terminal VDD through a fuse element 12. The other terminal of the n-type transistor 11b is grounded. The game terminals of the p-type MOS transistor 11a and the n-type transistor 11b are connected to receive the output signal of a NOR gate circuit 11c. One terminal of the input terminals of the NOR gate circuit 11c is connected to an operation mode switching circuit 10 to receive a mode switching signal therefrom while the other of the input terminals of the NOR gate circuit 11c is connected to the row selection line 53.

The operation mode switching circuit 10 is composed of a pull-down element 10a and inverters 10b, 10c and 10d. The input terminal of the operation mode switching circuit 10 is given an operation mode switching signal TEST in order to output the mode switching signal MD. The operation mode switching signal TEST is used to indicate operation mode switching between the normal operation mode and the test mode.

Next, the operations (A) and (B) of the present embodiment will be explained.

(A) The Operation of the Leakage Test Mode

In this mode, one of the row selection line 53 is detected which is connected to a memory cell 51 through which the leakage current is passed. When an external signal is given to the terminal TEST at the "H" level, the mode switching signal MD as output from the operation mode switching circuit 10 is pulled down to the "L" level. Also, a desired row address decoder 52 is activated by the address signals AIN and BIN as externally given so that the row selection line 53 connected to the row address decoder 52 as activated is pulled up to the "H" level.

The output signal of the NOR gate circuit 11c receiving these signals is pulled down to the "L" level so that the p-type MOS transistor 11a is made conductive while the n-type transistor 11b is made non-conductive. By this configuration, the common electric power source line VL and the electric power source VDD are connected to each other in order to supply the electric power source to the memory cell 51. Meanwhile, all the remaining row selection lines 53 not shown in the figure are pulled down to the "L" level.

By this configuration, the output signals of all the remaining NOR gate circuits 11c row selection lines 53 not shown in the figure are pulled up to the "H" level while the p-type MOS transistor 11a is made non-conductive and the n-type transistor 11b is made conductive. The common electric power source line VL and the electric power source VDD are then disconnected from each other in order to stop supplying the electric power source to the memory cell 51.

Also, all the block selection lines 55 are controlled in order to inactivate the word line selection circuits 56 on the standby mode in which the terminal /CE is pulled up to the "H" level. All the word lines 54 are therefore pulled down to the "L" level. Accordingly, it is determined, by sequentially selecting the respective row selection lines 53 and measuring the leakage current value for each selection, that a defective one of the memory cell 51 is included in the line having been selected when the leakage current value is no lower than the allowable value. The defective line is then replaced with a redundancy line prepared in advance by melting the fuse 12 connected to that row selection line 53 for cutting off the leakage current path.

The location of the memory cell as a leakage current path can be detected in this manner.

(B) The Operation of the Normal Operation Mode

When an external signal is not given to the terminal TEST, the "H" level is given to the gate terminal of the pull-down element 10a connected to the input terminal of the operation mode switching circuit 10, which is then made conductive in order to output the mode switching signal MD at the "H" level. The output signals of the NOR gate circuits 11c of all the selection circuits 11 receiving the mode switching signal MD are pulled down to the "L" level so that the p-type MOS transistor 11a is made conductive while the n-type transistor 11b is made non-conductive. By this configuration, the common electric power source line VL and the electric power source VDD are connected to each other in order to supply the electric power source to all the memory cell 51 and enable the operation of the semiconductor memory device.

Figure 1:
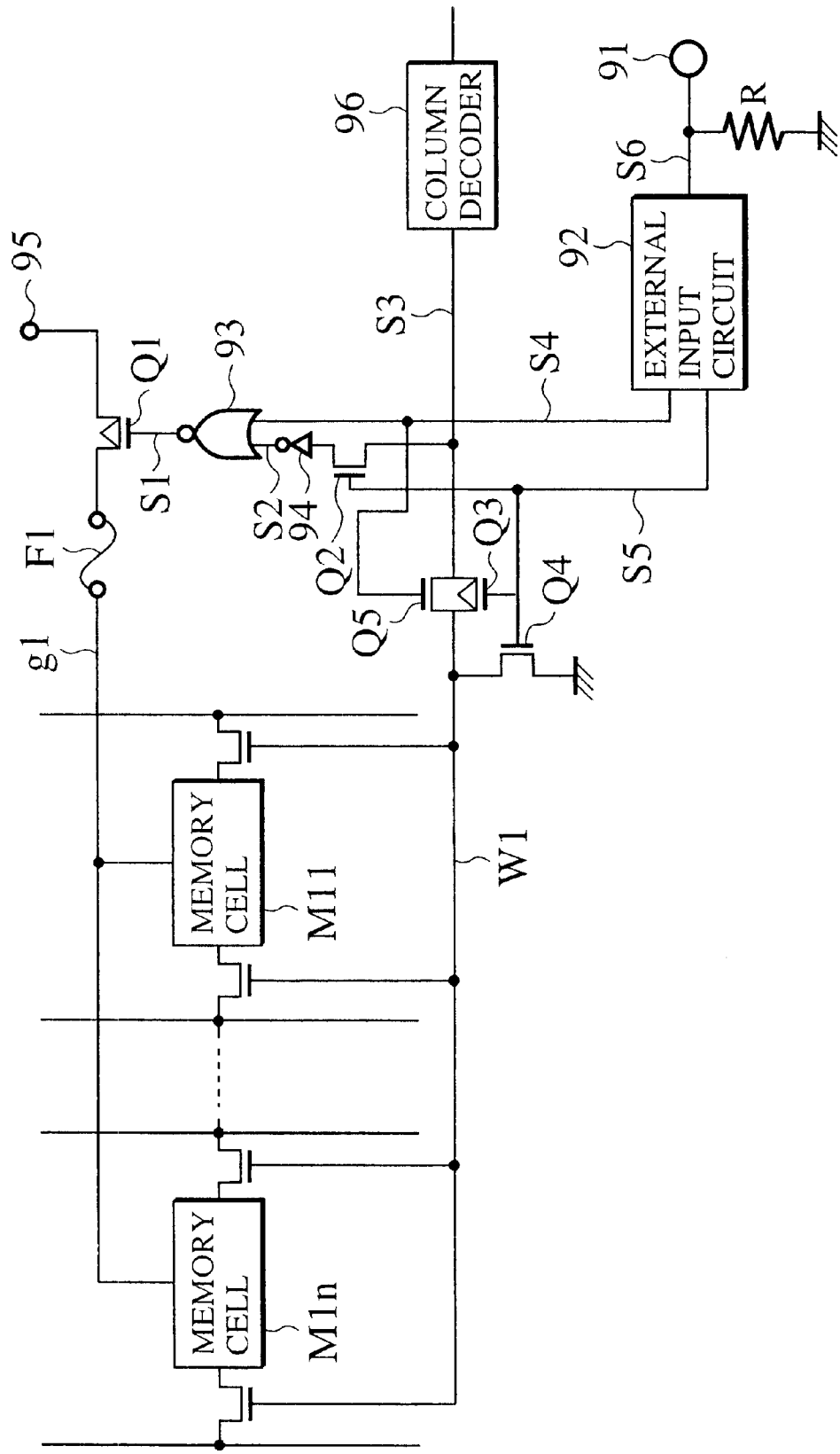
FIG. 1 is a circuit diagram showing the major elements of the configuration of a prior art semiconductor memory device.
Figure 2:
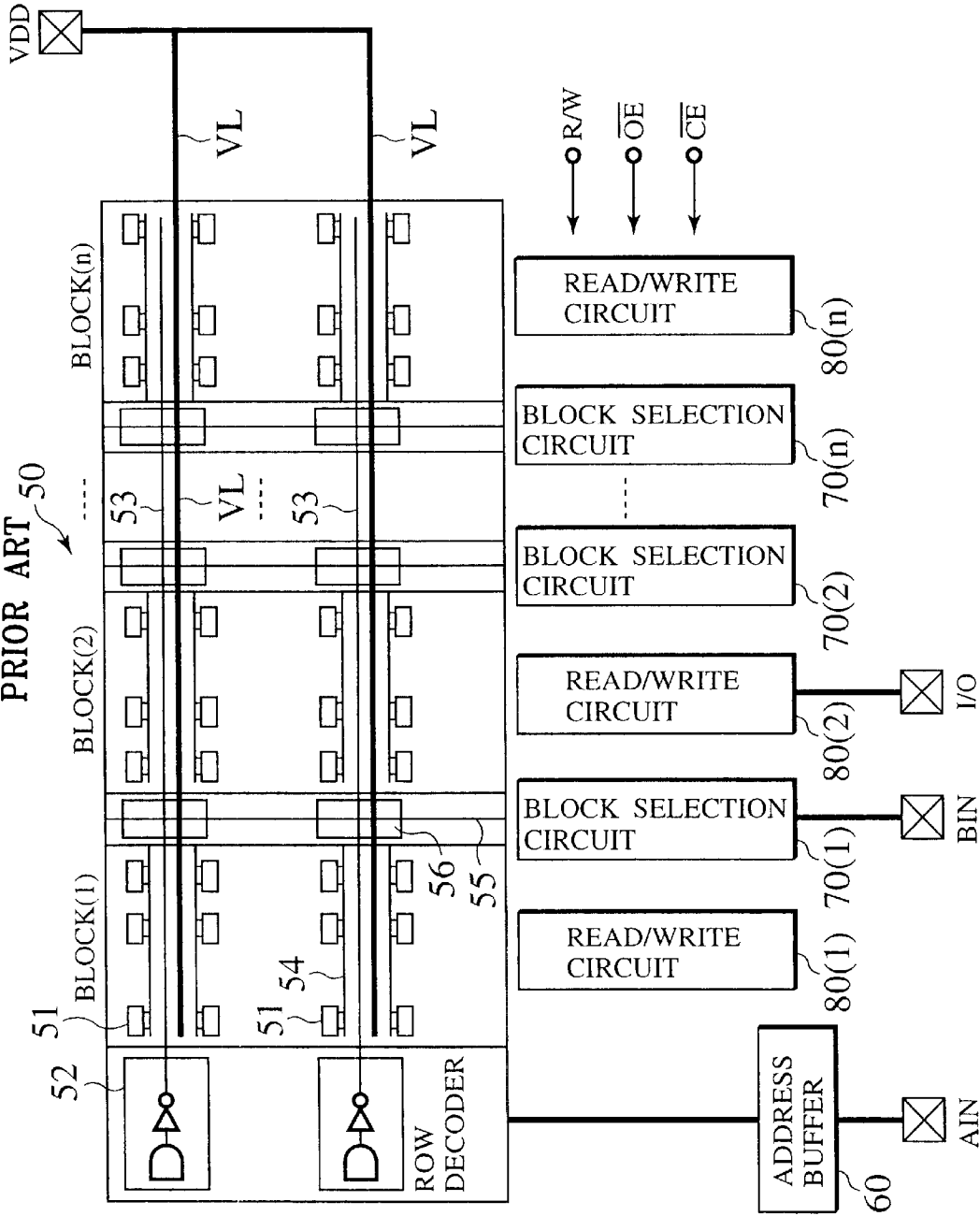
FIG. 2 is a block diagram showing the configuration of a prior art semiconductor memory device.

In the case of the present embodiment, the number of the constituent elements of the test circuit (the selection circuit 11) for each line can be reduced as compared with the conventional circuit as illustrated in FIG. 1 and therefore the increase in the chip size due to the test circuit is minimized.

[Second Embodiment]

In the case of the first embodiment of the present invention as described above, the location of the memory cell as a leakage current path can be detected by the use of the leak test mode. However, the time required for completing the leak test mode tends to be very long as the storage capacity increases. For example, in the case of a static circuit RAM with 512 row selection lines, the leak test has to be repeated for 512 times so that it takes 51.2 seconds to complete the leak test throughout the semiconductor memory device on the assumption that 100 milliseconds is required for each line. It takes 25 seconds to complete all the test procedures for confirming the normal operation of the semiconductor memory device. The addition of the leak test therefore triples the test time. In accordance with the second embodiment of the present invention, the leak test can be completed for a shorter time as explained in the following description.

Figure 7:
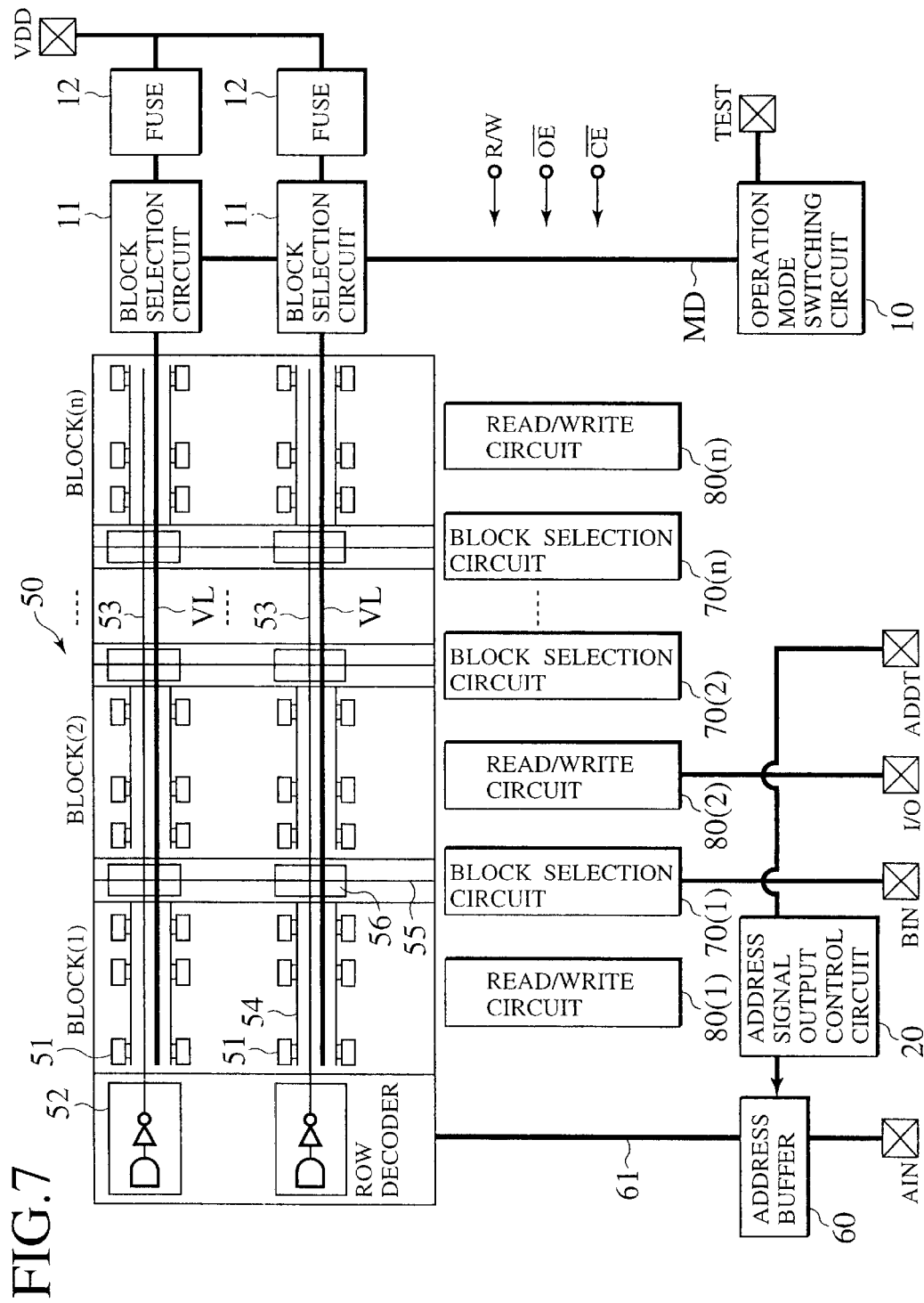
FIG. 7 is a block diagram showing the configuration of the semiconductor memory device in accordance with a second embodiment of the present invention.
Figure 8:
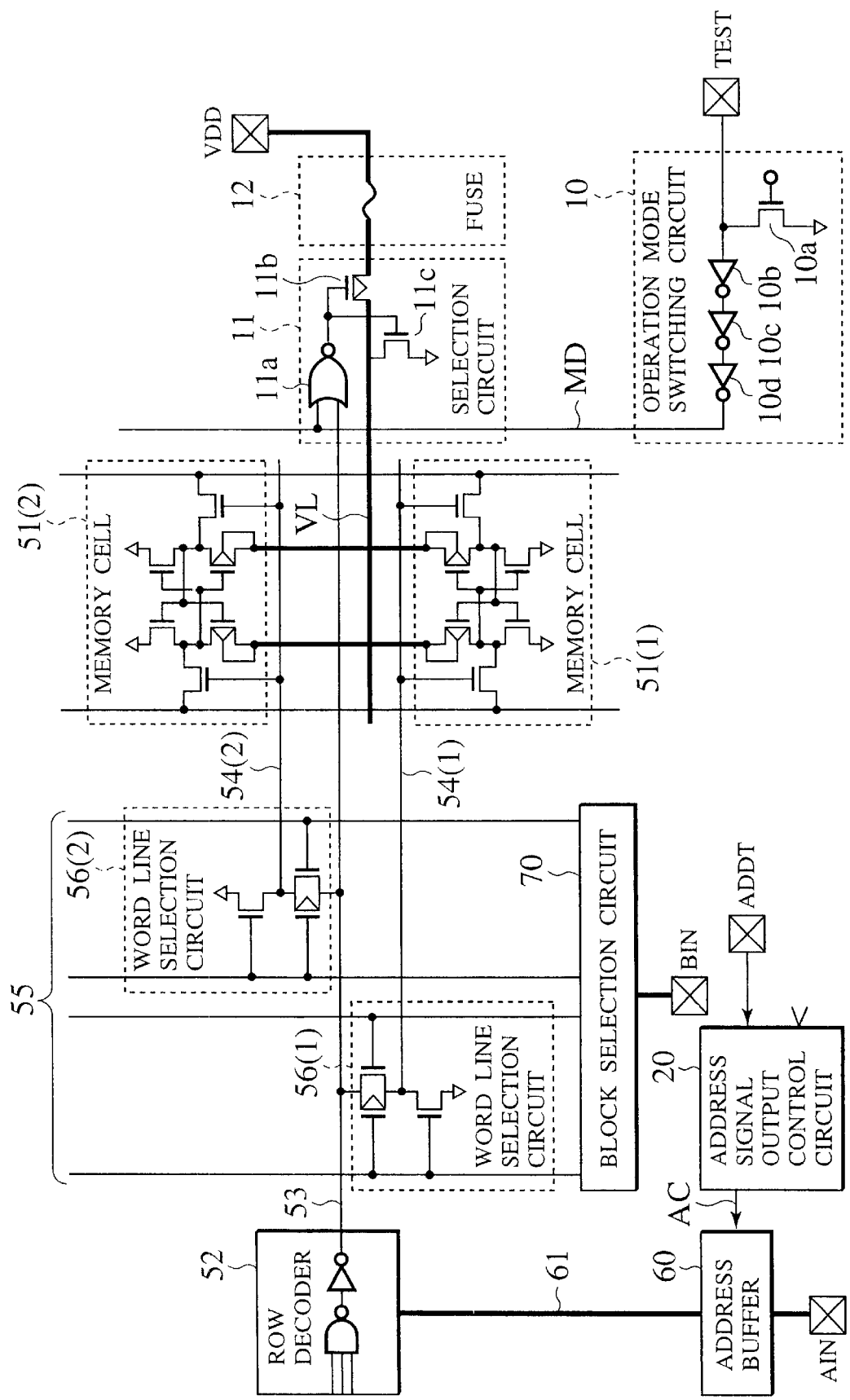
FIG. 8 is a practical circuit diagram showing the major elements of the semiconductor memory device as illustrated in FIG. 7.
Figure 9:
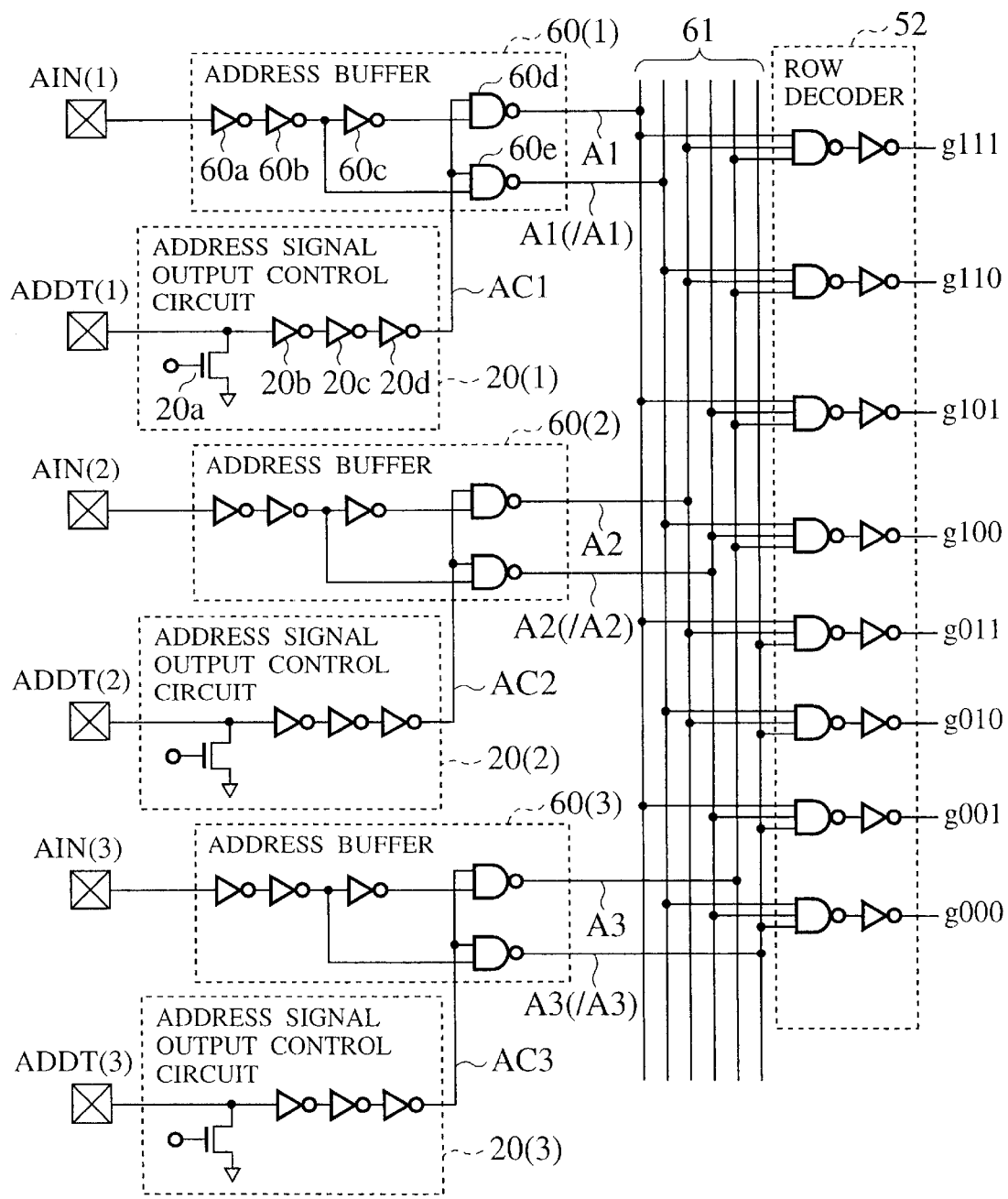
FIG. 9 is a circuit diagram showing an address signal output control circuit 20, which constitutes the characterized portion of the second embodiment of the present invention.

FIG. 7 is a block diagram showing the configuration of the semiconductor memory device in accordance with the second embodiment of the present invention. FIG. 8 is a practical circuit diagram showing the major elements of the semiconductor memory device as illustrated in FIG. 7. Also, FIG. 9 is a circuit diagram showing an address signal output control circuit 20, which constitutes the characterized portion of the present embodiment. In FIG. 7 and FIG. 8, like references indicative of identical or functionally similar elements are given as illustrated in FIG. 5 and FIG. 6 and therefore redundant explanation is not repeated.

The configuration in accordance with the present embodiment is provided with the address signal output control circuit 20 in addition to the configuration of the first embodiment of the present invention as described above, for controlling the output operation of the row address to an address buffer 80. As illustrated in FIG. 9, the address signal output control circuit 20 is composed of a pull-down element 20a and inverters 20b, 20c and 20d. The pull-down element 20a receives, at the gate thereof, the mode switching signal MD as output from the operation mode switching circuit 10. The address signal output control circuit 20 receives an address output control signal ADDT through an ADDT terminal and serves to output the output signal AC to the address buffer 60.

The operation of the present embodiment will be explained in the following description. The explanation will be made only in the case of controlling eight row selection lines 53 (i.e., g000 to g111) as illustrated in FIG. 9 for the sake of clarity in explanation.

In this embodiment of the present invention, three address buffers 60(1) to 60(3) are provided to receive three address signals AIN(1), AIN(2) and AIN(3) at the input terminals of the address buffers 60(1) to 60(3) respectively.

Each of the address buffer 60(1) to 60(3) is composed of inverters 60a, 60b and 60c and NAND circuits 60d and 60e which serves to drive the output terminal of the address buffer and receives the output signals AC1, AC2 or AC3 of the address signal output control circuit 20 at one of the input terminals thereof.

The address output control signal ADDT is not given to the terminal ADDT on the normal operation mode. VDD is given to the gate terminal of the pull-down element 20a connected to the input terminal of the operation mode switching circuit 20. The pull-down element 20a is then made conductive and therefore the output signals AC1, AC2 or AC3 of all the address signal output control circuits 20(1), 20(2) and 20(3) are fixed to the "H" level.

As a result, each of the address buffers 60(1) to 60(3) having two output terminals and serves to output the output signal A1, A2 or A3 in the same phase with the address signal AIN(1), AIN(2) or AIN(3) respectively through one of the two output terminals and output the output signal /A1, /A2 or /A3 in the opposite phase to the address signal AIN(1), AIN(2) or AIN(3) respectively through the other of the two output terminals.

The address output control signal ADDT is given to the terminal ADDT on the leak test mode. The output signals AC1, AC2 or AC3 of the respective address signal output control circuits 20(1), 20(2) and 20(3) are changed depending upon the address output control signals ADDT(1) to ADDT(3) as input to the ADDT terminal (1) to (3). For example, when the address output control signals ADDT(1) to ADDT(3) are pulled up to the "H" level, the pairs of the output terminals of the address buffers 60(1) to 60(3) are pulled up to the "H" level irrespective of the address signal AIN(1) to AIN(3).

The location of the leakage current path can be determined, as explained in the following description on the assumption that the leakage current is passed through the memory cell 51 connected to the row selection line g000 corresponding to the least significant bit as selected among from the eight row selection lines 53 in the case that all the address signals A1, A2 and A3 are pulled down to the "L" level.

Namely, the most significant four row selection lines g100 to g111 is selected at the same time when the address output control signals AC1 and AC2 are pulled up to the "H" level while the address output control signal AC3 is pulled down to the "L" level with all the address signals A1, A2 and A3 being pulled up to the "H" level. Also, the least significant four row selection lines g000 to g011 are selected at the same time when the address output control signals AC1 and AC2 are pulled up to the "H" level while the address output control signal AC3 is pulled down to the "L" level with the address signals A1 and A2 being pulled up to the "H" level and the address signals A3 being is pulled down to the "L" level. In this case as described above, the leakage current is not detected when A3="H" level while the leakage current is detected when A3="L" level. It is therefore determined that the leakage current path is located in either of the least significant four row selection lines corresponding to the case that A3="L" level.

Next, the least significant four row selection lines corresponding to the case that A3="L" level are investigated in the same manner as described above. In this case, the leakage current is detected when the row selection lines g000 and g001 are selected at the same time by giving appropriate levels to the address signals AIN(1), AIN(2) and AIN(3) and the address output control signals g000 to g001 while the leakage current is not detected when the row selection lines g010 and g011 are selected at the same time. Finally, the memory cell 51 connected to the row selection line g000 can be determined as a leakage current path by selecting either of the row selection lines g000 and g001.

For example, in the case of a static circuit RAM with 512 row selection lines one of which is connected to the memory cell 51 as a leakage current path, it is possible to determine 256 lines as possible leakage current paths among all the 512 lines by selecting either half at the same time respectively. Also, it is possible to determine 128 lines as next possible leakage current paths among all the previous possible 256 lines by selecting either half at the same time respectively. This procedure is repeated in the same manner.

Namely, since nine address signal lines are needed for decoding the 512 row selection lines 53, the test process can be completed by the above procedure repeated for 9×2=18 times. In this case, the test time is 100 milliseconds×18=1.8 seconds. It is therefore possible to significantly decrease the test time as compared to the case without the address output control signal. i.e., 51.2 seconds.

In accordance with the present embodiment, since the address signal output control circuit 20 is provided for enabling selection of a plurality of the row selection lines 53 at the same time, the location of a memory cell as a leakage current path can be quickly detected for a short time.

[Third Embodiment]

In the case of the second embodiment of the present invention as described above, the address signal output control circuit 20 has to be provided for each address buffer 60 in a one-to-one correspondence. The number of external signals to be given and the number of terminals to be provided within a chip are substantially increased so that the test device has to be provided with a larger number of terminals and the chip size tends to increase. In accordance with the present embodiment, the address output control signals ADDT are given through I/O terminals for the purpose of preventing both the number of terminals of the test device and the chip size from being increased.

Figure 10:
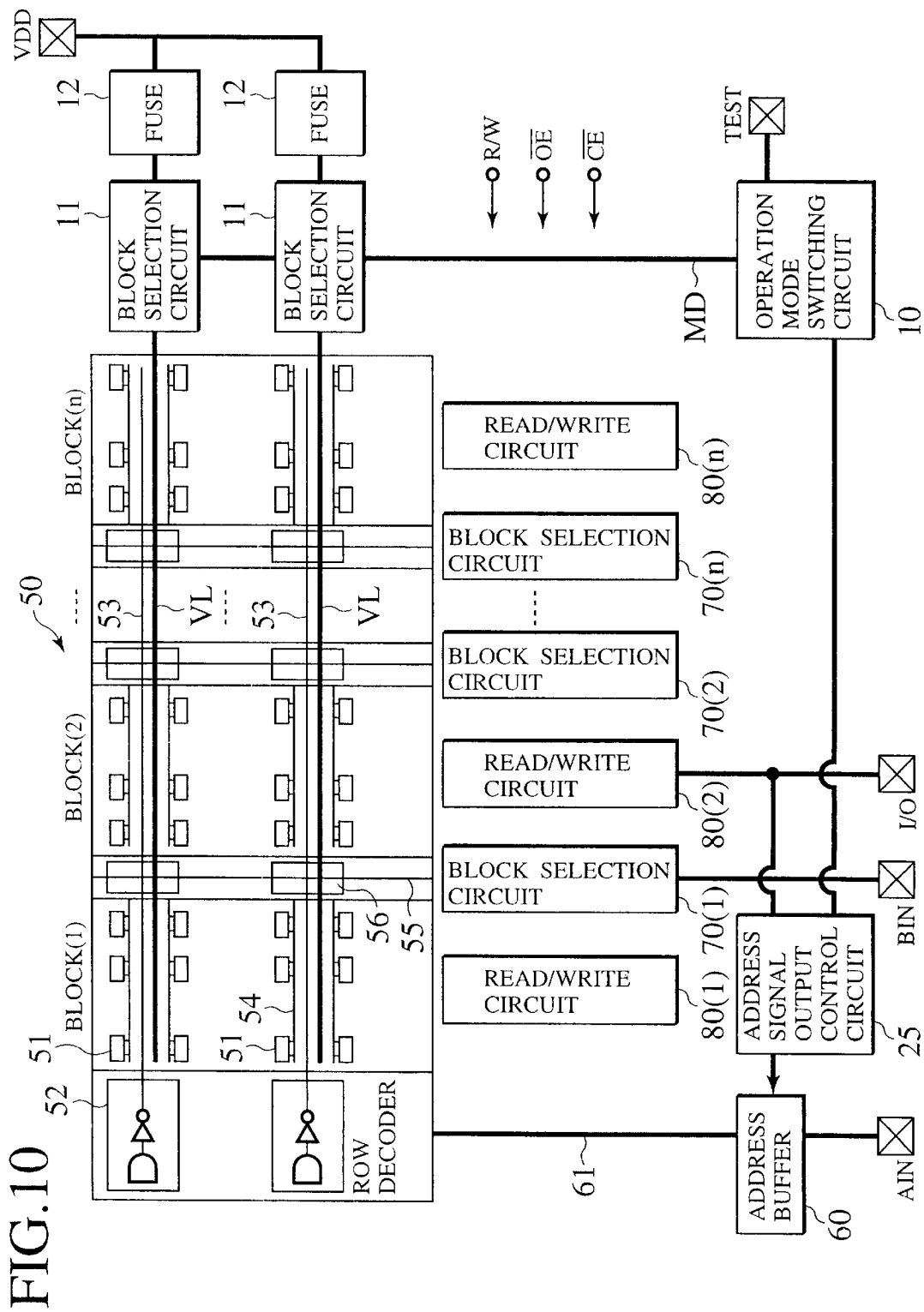
FIG. 10 is a block diagram showing the configuration of the semiconductor memory device in accordance with a third embodiment of the present invention.
Figure 11:
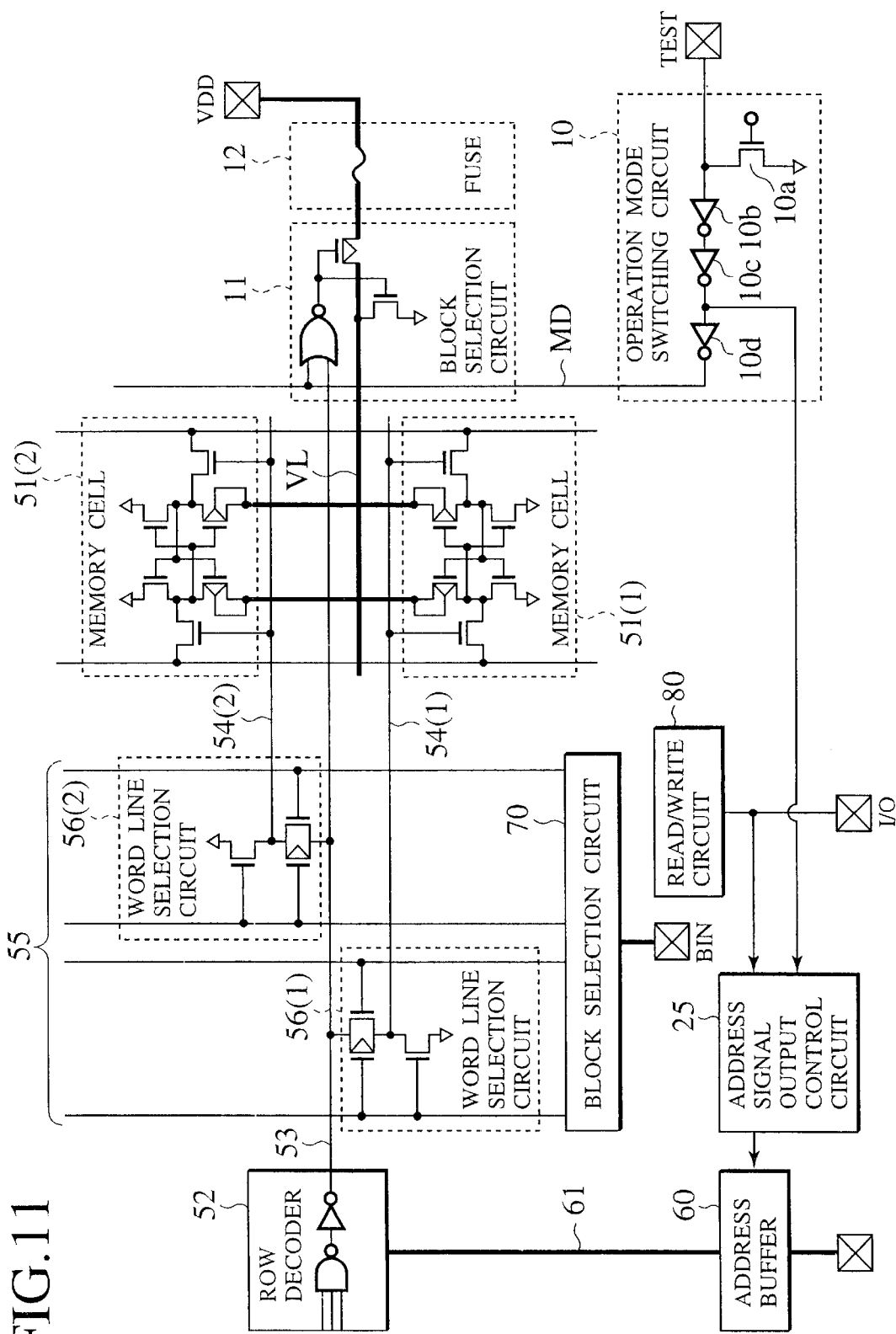
FIG. 11 is a practical circuit diagram showing the major elements of the semiconductor memory device as illustrated in FIG. 10.
Figure 12:
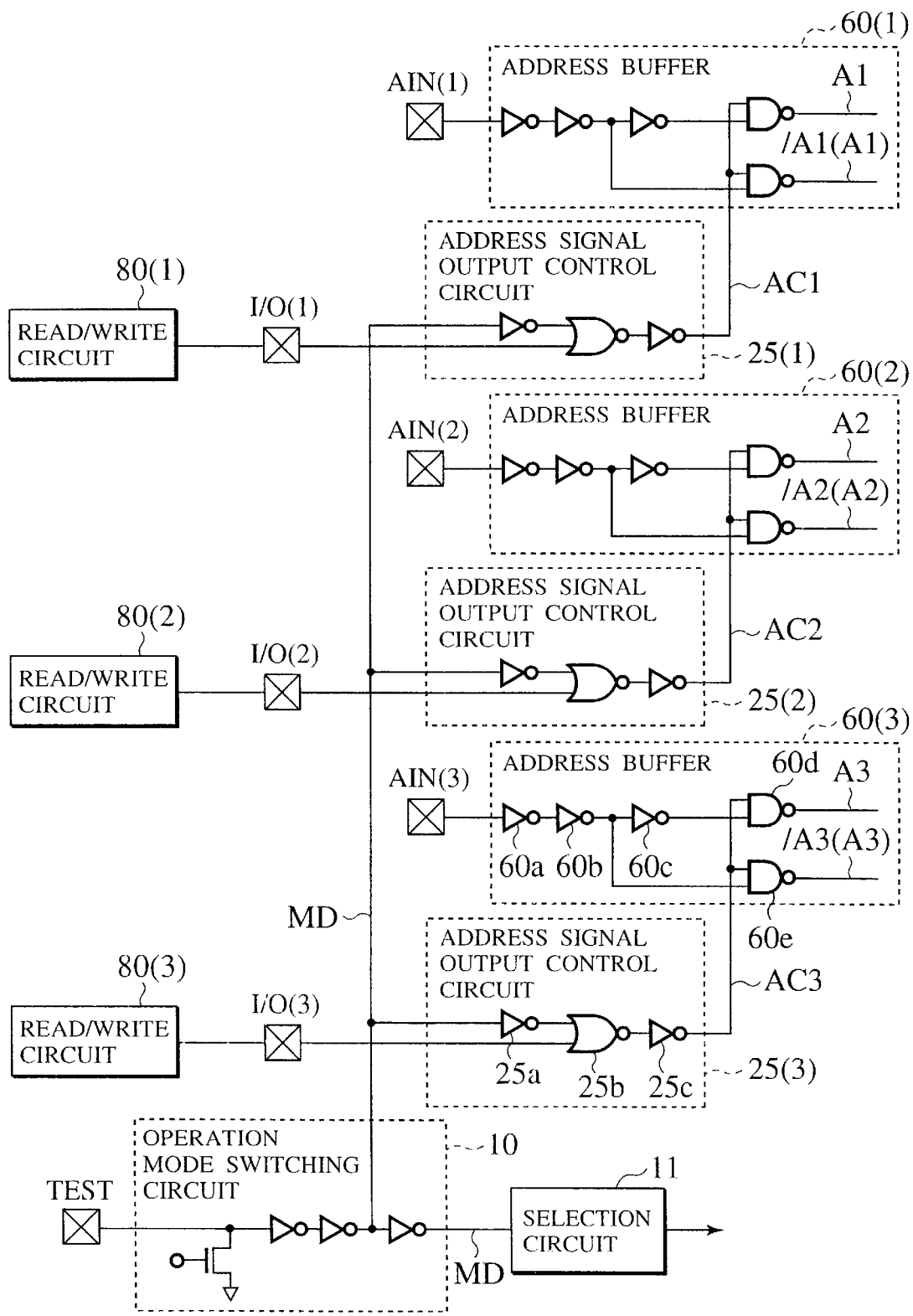
FIG. 12 is a circuit diagram showing the periphery of an address signal output control circuit, which constitutes the characterized portion of the third embodiment of the present invention.

FIG. 10 is a block diagram showing the configuration of the semiconductor memory device in accordance with a third embodiment of the present invention. FIG. 11 is a circuit diagram showing the major elements of the semiconductor memory device as illustrated in FIG. 10. Also, FIG. 12 is a circuit diagram showing an address signal output control circuit 25, which constitutes the characterized portion of the present embodiment. In the figures, like references indicative of identical or functionally similar elements are given as illustrated in FIG. 5 and FIG. 6, and therefore redundant explanation is not repeated.

The configuration in accordance with the present embodiment is distinguished from the second embodiment of the present invention as described above in that the address output control signals ADDT are given through existing I/O terminals without particular ADDT terminal which are additionally and separately provided for the purpose of giving external address output control signals ADDT. For this purpose, an address signal output control circuits 25 are provided with a different configuration than the address signal output control circuit 20.

Namely, each address signal output control circuit 25 is composed of inverter 25a and 25c and a NOR gate circuit 25b as illustrated in FIG. 12. The mode switching signal MD as outputted from the operation mode switching circuit 10 is input to one terminal of the input terminals of the NOR gate circuit 25b through the inverter 25a while the address output control signal ADDT given through the I/O terminal is input to the other of the input terminals of the NOR gate circuit 25b whose output signal is passed through the inverter 25c.

The I/O terminals are used to perform the read/write operation of user data in the normal operation. On the test mode, since the reading and writing circuits 80(1) to 80(3) are inactivated, the signals as externally given to the I/O terminals are input to the address signal output control circuits 25(1), 25(2) and 25(3) as the address output control signal ADDT(1) to ADDT(3).

By this configuration, there is no longer need for the terminals ADDT as illustrated in FIG. 9 to minimize the increase in the chip size.

[Fourth Embodiment]

Figure 13:
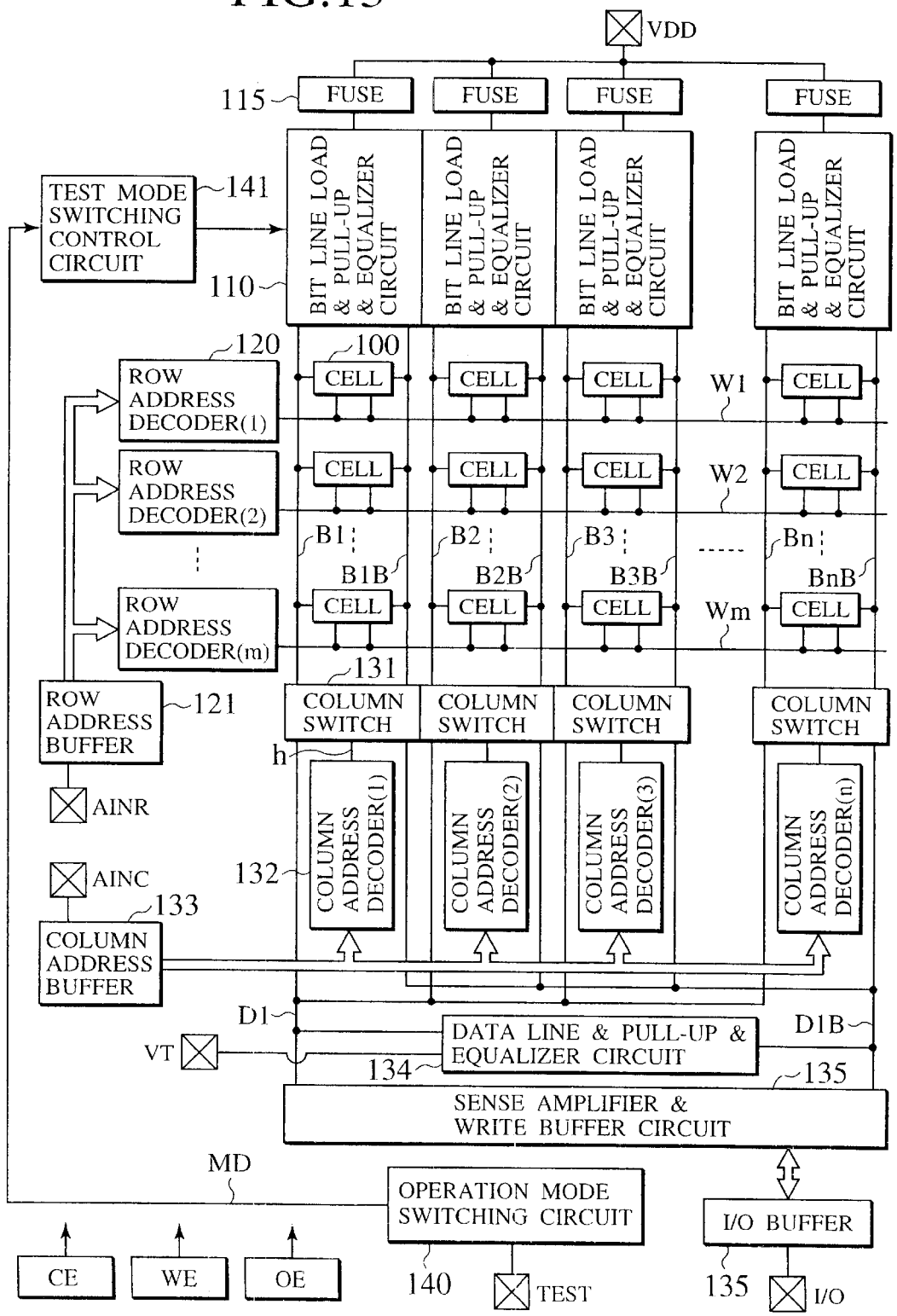
FIG. 13 is a block diagram showing the configuration of the semiconductor memory device in accordance with a fourth embodiment of the present invention.

FIG. 13 is a block diagram showing the configuration of the semiconductor memory device in accordance with a fourth embodiment of the present invention. FIG. 14 is a circuit diagram showing a peripheral circuit provided for each bit line pair as the major elements of the semiconductor memory device as illustrated in FIG. 13. In the figures, like references indicative of identical or functionally similar elements are given as illustrated in FIG. 3, and therefore redundant explanation is not repeated.

Figure 3:
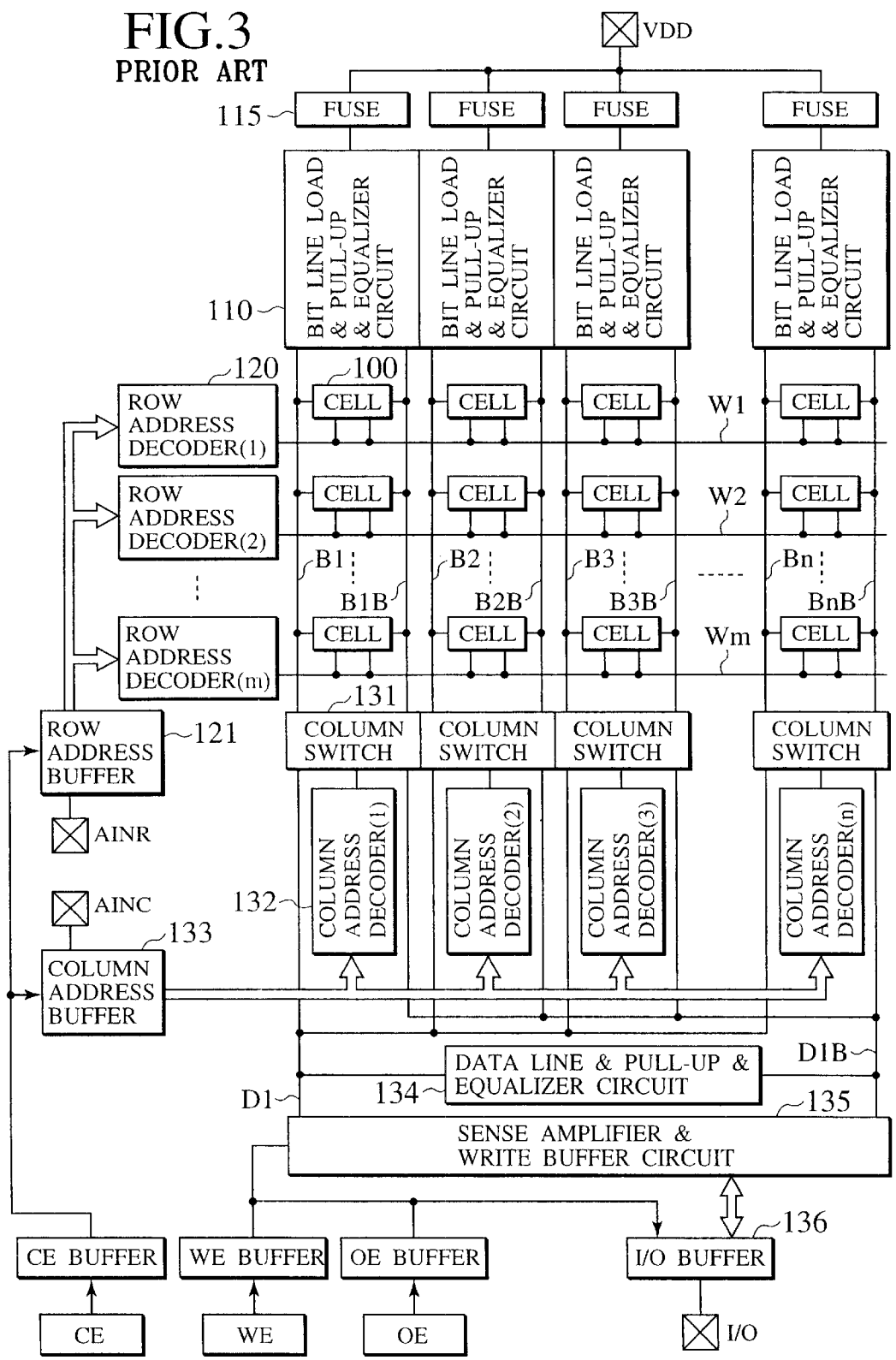
FIG. 3 is a block diagram showing the configuration of another prior art semiconductor memory device.
Figure 4:
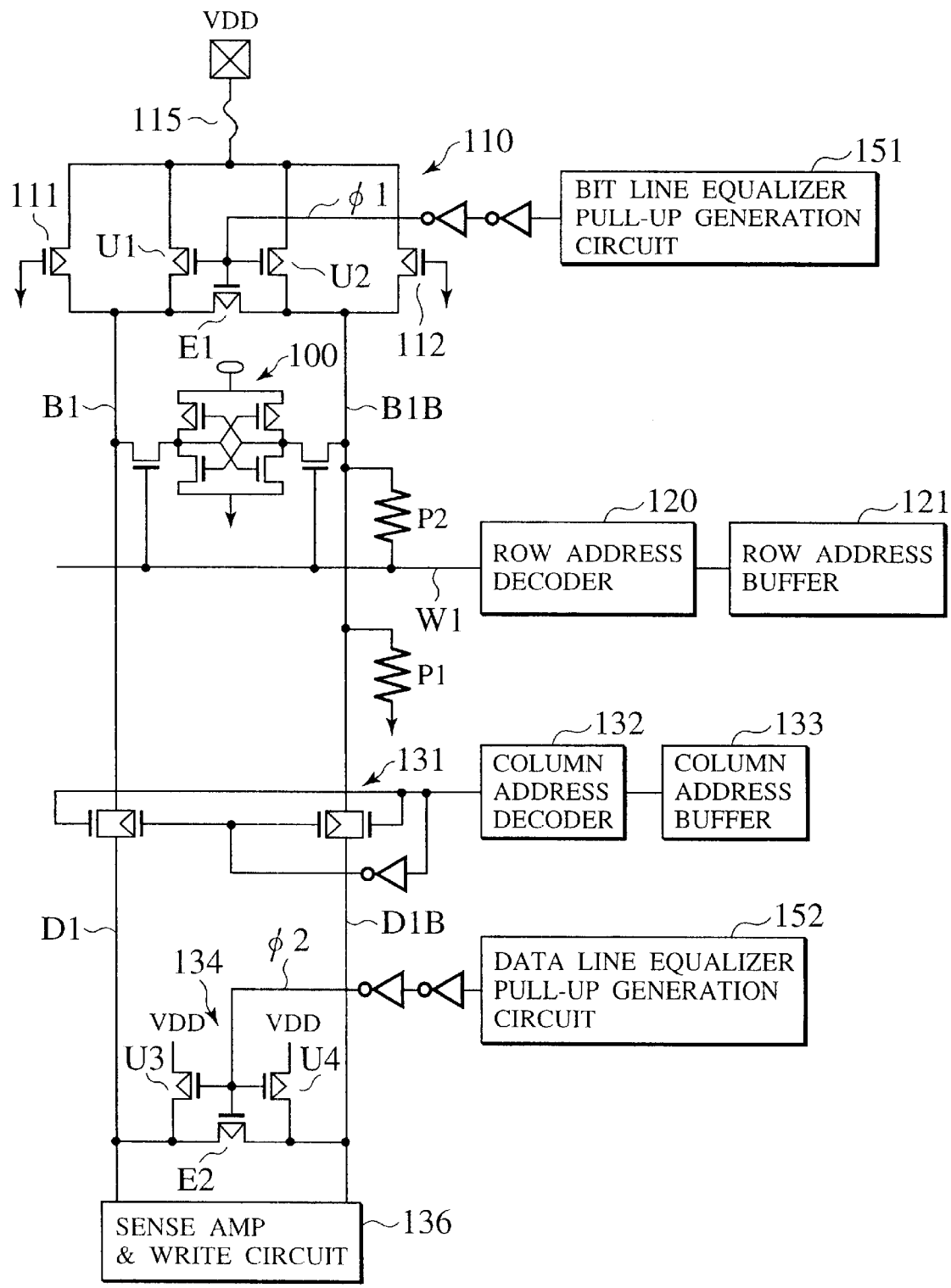
FIG. 4 is a circuit diagram showing a peripheral circuit provided for each bit line pair as the major elements of the semiconductor memory device as illustrated in FIG. 3.

The semiconductor memory device in accordance with the present embodiment is provided with a power terminal VT for test connected to the data line pull-up & equalizer circuit 134 of in accordance with the prior art semiconductor memory device as illustrated in FIG. 3 as well as an operation mode switching circuit 140 and a test mode switching control circuit 141.

The operation mode switching circuit 140 is composed of a pull-down element 140a and inverters 140b and 140c and given an operation mode switching signal TEST as an input signal through a TEST terminal in order to output the mode switching signal MD. The operation mode switching signal TEST is used to indicate switching between the normal operation mode and the test mode. Also, the test mode switching control circuit 141 is used to control the bit line load & pull-up & equalizer circuit 110 in order to cut off the electric power supply to the respective bit lines from the power terminal VDD connected to one ends of the bit line pairs B1, B1B, . . . , Bn, BnB.

More specifically speaking, as illustrated in FIG. 14, the transfer gates of each memory cell 100 are connected to the bit line pair B1 and B1B while the bit line load & pull-up & equalizer circuit 110 is connected to the top ends of the bit line pair B1 and B1B. The bit line load & pull-up & equalizer circuit 110 is composed of a bit line load circuit 111, an equalizer element E1 and bit line pull-up circuits U1 and U2. A fuse 115 for separating the bit lines from the power is connected between the power terminal VDD and the bit line load & pull-up & equalizer circuit 110.

Furthermore, a column switch 131 is located between the bottom locations of each pair of the bit lines B1 and B1B and each pair of the data lines D1 and D1B, which are connected to the sense amplifier & write buffer circuit 135 for reading/writing data.

The test terminal TEST for receiving an external test signal is connected to the pull-down element 140a of the operation mode switching circuit 140 which serves to output the mode switching signal MD to the input terminal of the test mode switching control circuit 141 and the gate of the bit line load circuit 111 and 112.

The test mode switching control circuit 141 is composed of a NAND circuit 141a and inverters 141b and 141c. The inverter 141b receives the output signal of the bit line equalizer pull-up generation circuit 151 through the input terminal thereof while the inverter 141c receives the mode switching signal MD at the input terminal thereof. By this configuration, the mode switching signal MD is transferred to the gate of the bit line equalizer element E1 and the gates of the bit line pull-up circuits U1 and U2 through the inverter 141c and the NAND circuit 141a.

The data lines D1 and D1B are connected to the bit line pull-up circuits U3 and U4 and the data line equalizer element E2 which constitutes the data line pull-up & equalizer circuit 134. The bit line pull-up circuits U3 and U4 are connected to the power terminal VT which is particularly provided for the leak test. Meanwhile, the power terminal VT can be the conventional power terminal VCC.

Next, (A) the operation of the leak test mode and (B) the operation of the normal operation mode will be explained.

(A) The Operation of the Leak Test Mode

When the bit line as a path of the leakage current is to be detected, the operation mode switching signal TEST is externally given to the test terminal TEST at the "H" level. The mode switching signal MD at the "H" level is output through the operation mode switching circuit 140 so that the output signal φ1 of the test mode switching control circuit 141 is pulled up to the "H" level while the bit line pull-up circuits U1 and U2 and the bit line equalizer element E1 are made non-conductive.

On the other hand, a desired column switch 131 is selectively made conductive by means of the address signal as externally given through the column address decoder 132 in order to select the bit lines connected thereto. By this configuration, the bit lines as selected are connected to the data lines D1 and D1B and separated from the power terminal VDD while all the remaining bit lines as not selected are floating.

On the other hand, the bit line pull-up circuits U3 and U4 and the data line equalizer element E2 are made conductive in the same manner as on the usual standby mode.

In such a condition, in the case that the current measurement is conducted by means of the electric power source connected to the power terminal VT which is particularly provided for the leak test, a leakage current is detected through the bit line pull-up circuits U3 and U4 and the column switch 131 from the power terminal VT when the bit line as a current leakage path are selected in accordance with the column address given.

Accordingly, it is determined, by sequentially selecting the column switch 131 and measuring the leakage current value for each selection, that a defective path is located in the line having been selected when the leakage current value is no lower than the allowable value. The defective column is then replaced with a redundancy column prepared in advance by melting the fuse 12 connected to that column selection line for cutting off the leakage current path resulting in increase of the device yield.

(B) The Operation of the Normal Operation Mode

The operation mode switching signal TEST is not given to the test terminal TEST and therefore the mode switching signal MD is pulled down to the "L" level by means of the pull-down element 140a of the operation mode switching circuit 140. By this configuration, the PMOS gate circuits 111 and 112 as the bit line load circuit are turned on and become operative while the bit line pull-up circuits U1 and U2 and the bit line equalizer element E1 are controlled by the signal of the bit line equalizer pull-up generation circuit 151. Accordingly, the semiconductor memory device can operate on the normal operation mode.

[Fifth Embodiment]

In the case of the fifth embodiment of the present invention as described above, the location of the memory cell as a leakage current path can be detected by the use of the leak test mode. However, the time required for completing the leak test mode tends to be very long as the storage capacity increases. For example, in the case of a static circuit RAM with 512 column selection lines, the leak test has to be repeated for 512 times so that it takes 51.2 seconds to complete the leak test throughout the semiconductor memory device on the assumption that 100 milliseconds is required for each column. It takes 25 seconds to complete all the rest procedures for confirming the normal operation of the semiconductor memory device. The addition of the leak test therefore triples the test time. In accordance with the fifth embodiment of the present invention, the leak test can be completed for a shorter time as explained in the following description.

Figure 15:
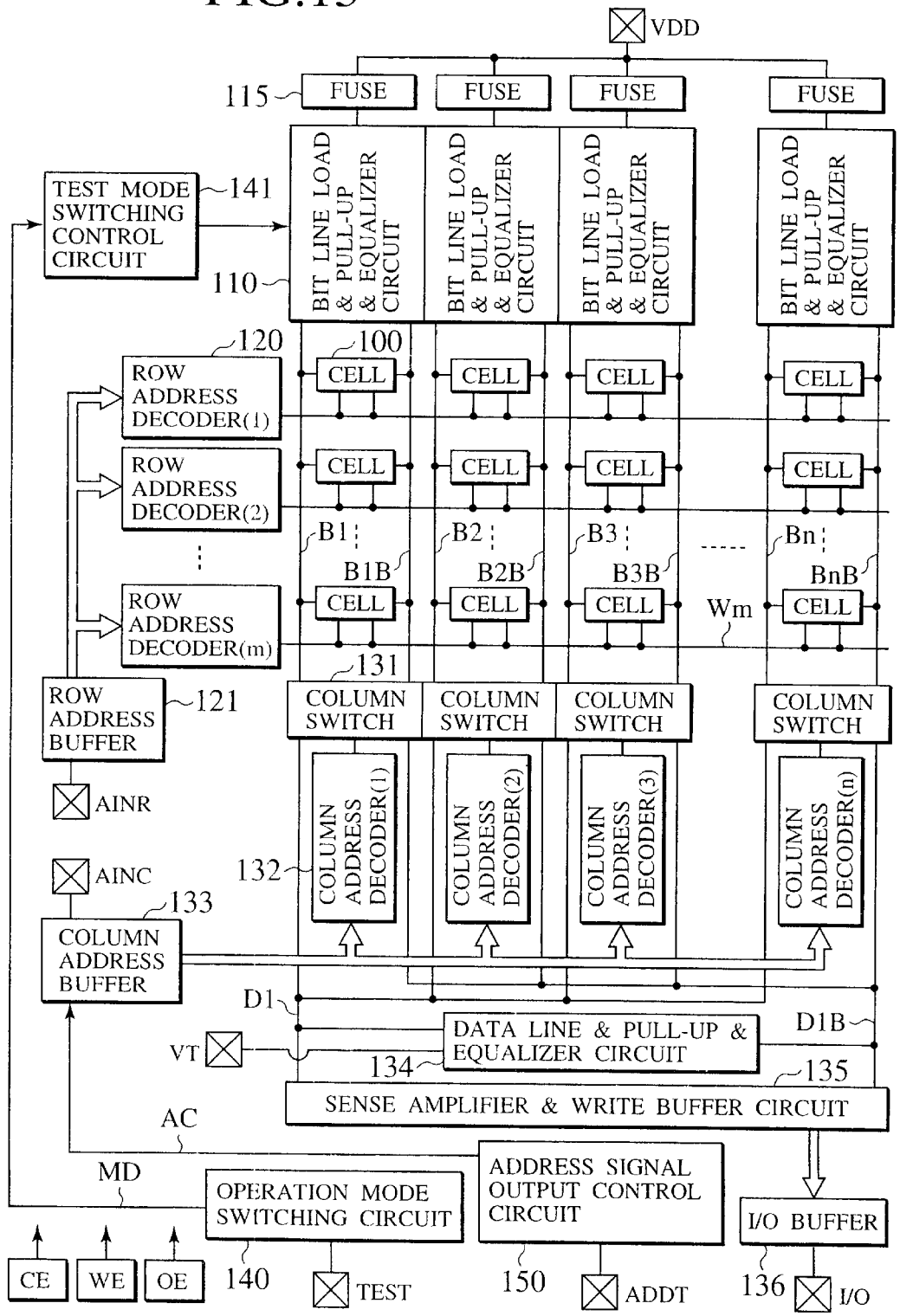
FIG. 15 is a block diagram showing the configuration of the semiconductor memory device in accordance with a fourth embodiment of the present invention.
Figure 16:
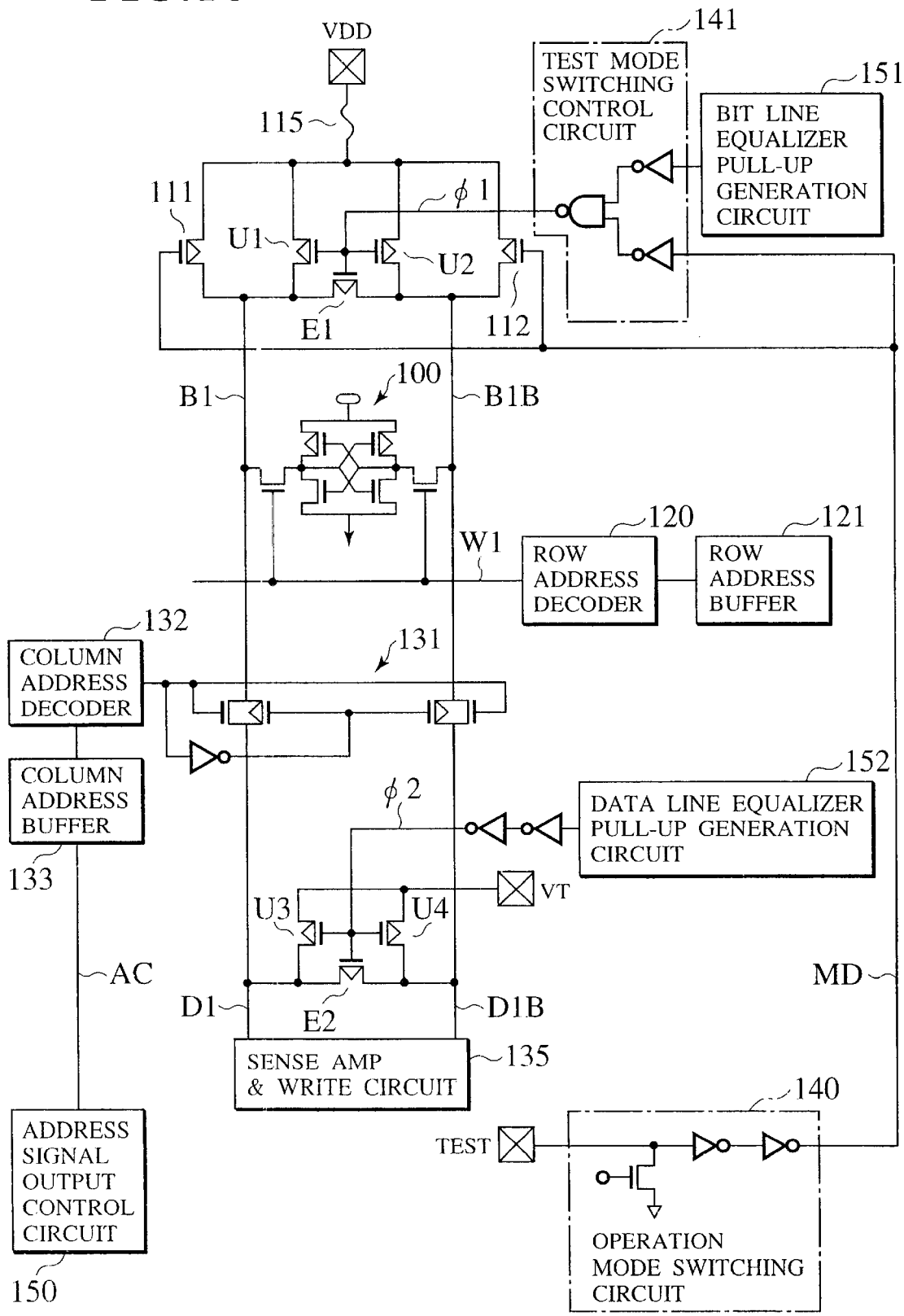
FIG. 16 is a circuit diagram showing a peripheral circuit provided for each bit line pair as the major elements of the semiconductor memory device as illustrated in FIG. 15.
Figure 17:
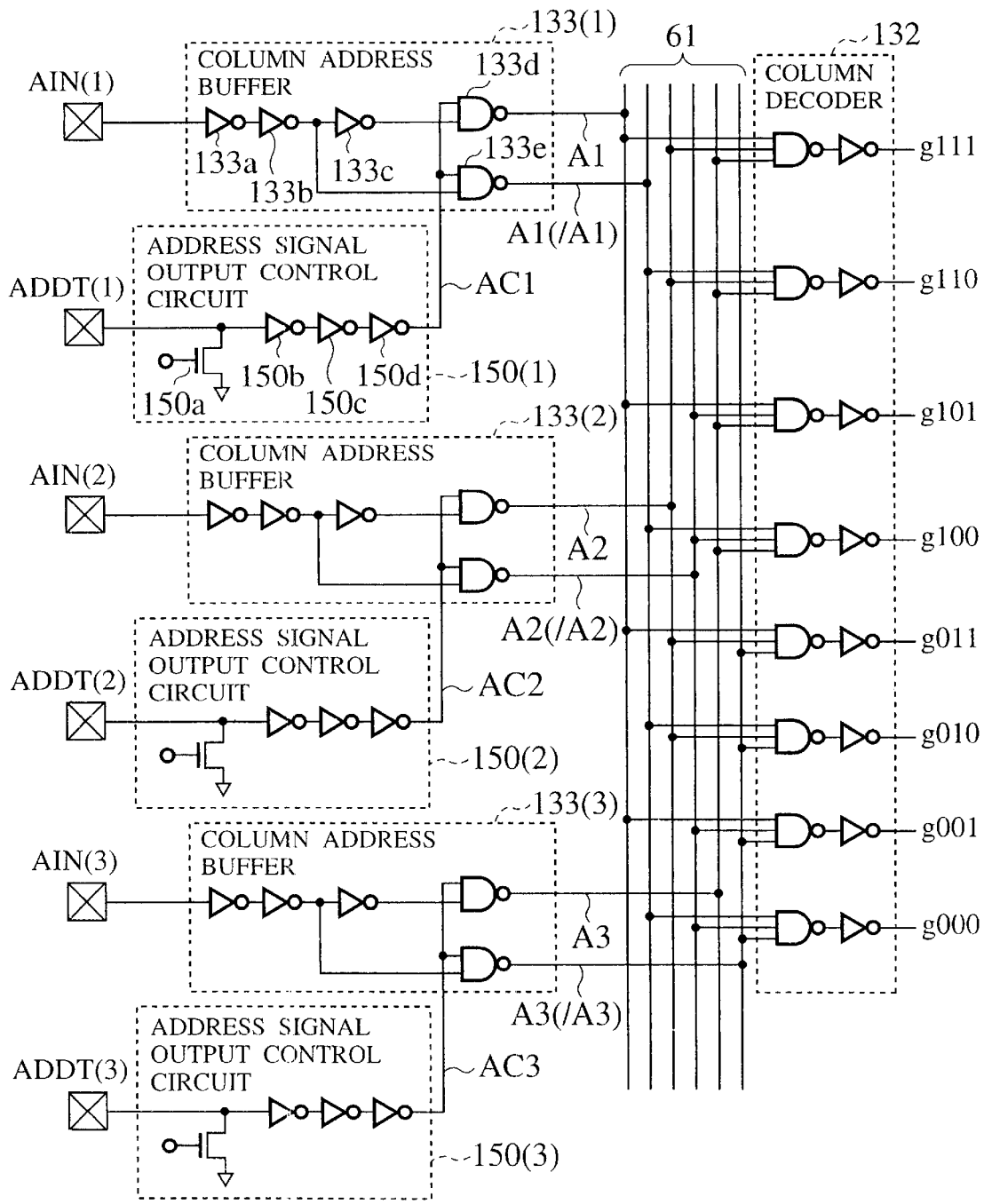
FIG. 17 is a circuit diagram showing an address signal output control circuit 20, which constitutes the characterized portion of the fourth embodiment of the present invention.

FIG. 15 is a block diagram showing the configuration of the semiconductor memory device in accordance with a fourth embodiment of the present invention. FIG. 16 is a circuit diagram showing a peripheral circuit provided for each bit line pair as the major elements of the semiconductor memory device as illustrated in FIG. 15. Also, FIG. 17 is a circuit diagram showing an address signal output control circuit 20, which constitutes the characterized portion of the present embodiment. In FIG. 15 and FIG. 16, like references indicative of identical or functionally similar elements are given as illustrated in FIG. 13 and FIG. 14 and therefore redundant explanation is not repeated.

The configuration in accordance with the present embodiment is provided with an address signal output control circuit 150 in addition to the configuration of the fifth embodiment of the present invention as described above, for controlling the output operation of the column address to an address buffer 133. As illustrated in FIG. 17, the address signal output control circuit 150 is composed of a pull-down element 150a and inverters 150b, 150c and 150d. The pull-down element 150a receives, at the gate thereof, the mode switching signal MD as output from the operation mode switching circuit 10. The address signal output control circuit 150 receives an address output control signal ADDT through an ADDT terminal and serves to output the output signal AC to the address buffer 133.

The operation of the present embodiment will be explained in the following description. The explanation will be made only in the case of controlling eight column selection lines (i.e., h000 to h111) as illustrated in FIG. 17 for the sake of clarity in explanation.

In this embodiment of the present invention, three column address buffer 133(1) to 133(3) are provided to receive three address signals AIN(1), AIN(2) and AIN(3) at the input terminals of the address buffers 133(1) to 133(3) respectively.

Each of the address buffer 133(1) to 133(3) is composed of inverters 133a, 133b and 133c and NAND circuits 133d and 133e which serves to drive the output terminal of the address buffer and receives the output signals AC1, AC2 or AC3 of the address signal output control circuit 15 at one of the input terminals thereof.

The address output control signal ADDT is not given to the terminal ADDT on the normal operation mode. VDD is given to the gate terminal of the pull-down element 150a connected to the input terminal of the operation mode switching circuit 20. The pull-down element 150a is then made conductive and therefore the output signals AC1, AC2 or AC3 of all the address signal output control circuits 150(1), 150(2) and 150(3) are fixed to the "H" level.

As a result, each of the address buffers 60(1) to 601(3) having two output terminals and serves to output the output signal A1, A2 or A3 in the same phase with the address signal AIN(1), AIN(2) or AIN(3) respectively through one of the two output terminals and output the output signal /A1, /A2 or /A3 in the opposite phase to the address signal AIN(1), AIN(2) or AIN(3) respectively through the other of the two output terminals.

The address output control signal ADDT is given to the terminal ADDT on the leak test mode. The output signals AC1, AC2 or AC3 of the respective address signal output control circuits 150(1), 150(2) and 150(3) are changed depending upon the address output control signals ADDT(1) to ADDT(3) as input to the ADDT terminal (1) to (3). For example, when the address output control signals ADDT(1) to ADDT(3) are pulled up to the "H" level, the pairs of the output terminals of the address buffers 133(1) to 133(3) are pulled up to the "H" level irrespective of the address signal AIN(1) to AIN(3).

The location of the leakage current path can be determined, as explained in the following description on the assumption that the leakage current is passed through a bit line connected to the column selection line h000 corresponding to the least significant bit as selected among from the eight column selection lines in the case that all the address signals A1, A2 and A3 are pulled down to the "L" level.

Namely, the most significant four column selection lines h100 to h111 are selected at the same time when the address output control signals AC1 and AC2 ore pulled up to the "H" level while the address output control signal AC3 is pulled down to the "L" level with all the address signals A1, A2 and A3 being pulled up to the "H" level. Also, the least significant four column selection lines h000 to h011 is selected at the same time when the address output control signals AC1 and AC2 are pulled up to the "H" level while the address output control signal AC3 is pulled down to the "L" level with the address signals A1 and A2 being pulled up to the "H" level and the address signals A3 being is pulled down to the "L" level. In this case as described above, the leakage current is not detected when A3="H" level while the leakage current is detected when A3="L" level. It is therefore determined that the leakage current path is located in either of the least significant four column selection lines corresponding to the case that A3="L" level.

Next, the least significant four column selection lines corresponding to the case that A3="L" level are investigated in the same manner as described above. In this case, the leakage current is detected when the column selection lines h000 and h001 are selected at the same time by giving appropriate levels to the address signals AIN(1), AIN(2) and AIN(3) and the address output control signals ADDT(1) to ADDT(3) while the leakage current is not detected when the column selection lines h010 and h011 are selected at the same time. Finally, the bit line connected to the column selection line h000 can be determined as a leakage current path by selecting either of the column selection lines h000 and h001.

For example, in the case of a static circuit RAM with 512 column selection lines one of which is connected to the bit lines as a leakage current path, it is possible to determine 256 column selection lines as possible leakage current paths among all the 512 column selection lines by selecting either half at the same time respectively. Also, it is possible to determine 128 column selection lines as next possible leakage current paths among all the previous possible 256 column selection lines by selecting either half at the same time respectively. This procedure is repeated in the same manner.

Namely, since nine address signal lines are needed for decoding the 512 column selection lines, the test process can be completed by the above procedure repeated for 9×2=18 times. In this case, the test time is 100 milliseconds×18=1.8 seconds. It is therefore possible to significantly decrease the test time as compared to the case without the address output control signal, i.e., 51.2 seconds.

In accordance with the present embodiment, since the address signal output control circuit 150 is provided for enabling selection of a plurality of the column selection lines at the same time, the location of a bit line as a leakage current path can be quickly detected for a short time.

[Sixth Embodiment]

Figure 18:
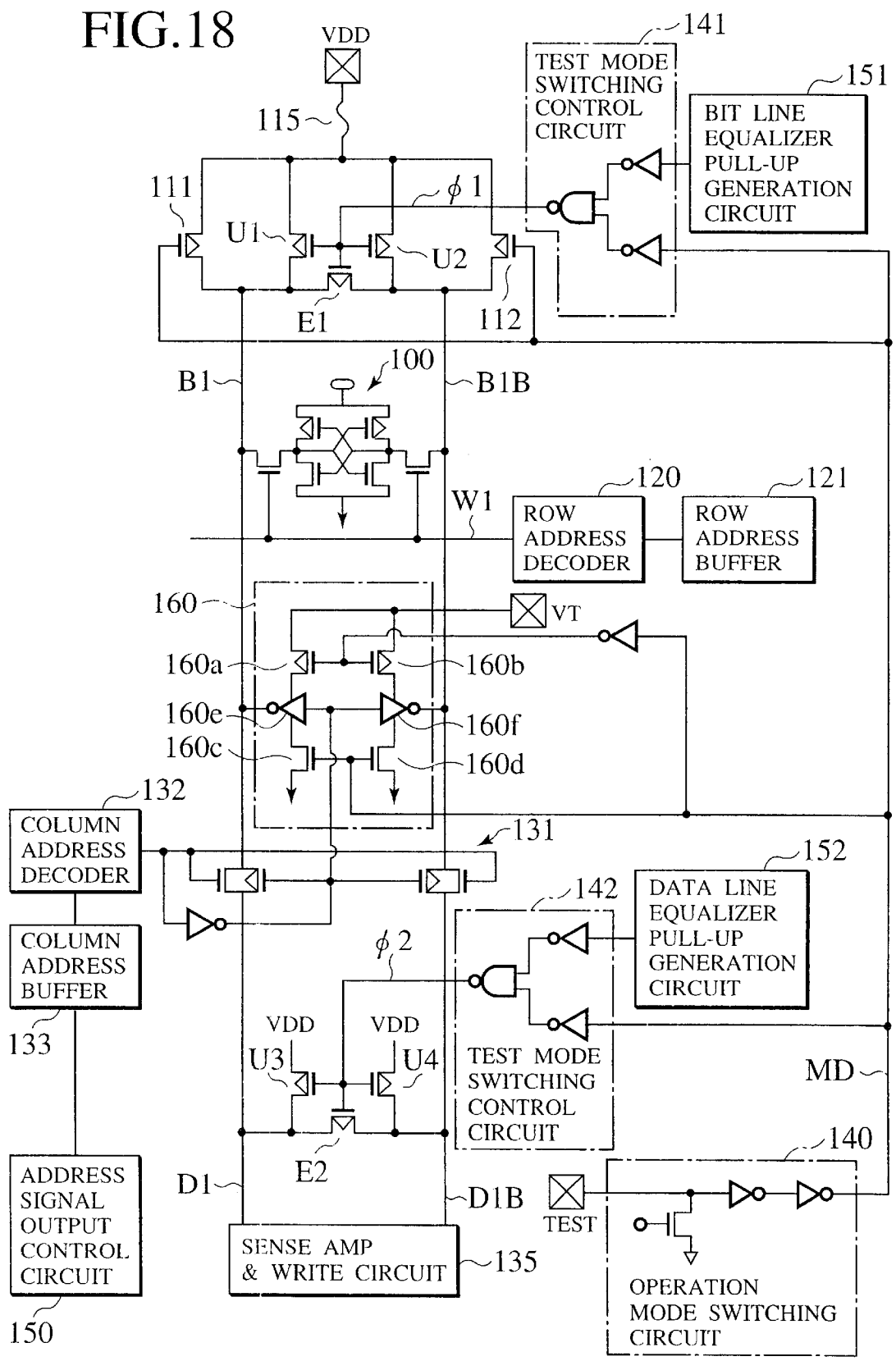
FIG. 18 is a practical circuit diagram showing the major elements of the configuration of the semiconductor memory device in accordance with a sixth embodiment of the present invention.

FIG. 18 is a practical circuit diagram showing the major elements of the configuration of the semiconductor memory device in accordance with a sixth embodiment of the present invention. In the figure, like references indicative of identical or functionally similar elements are given as illustrated in FIG. 16 and therefore redundant explanation is not repeated.

The configuration in accordance with the present embodiment is provided with a bit line leakage load circuit 160 for each pair of the bit lines in addition to the configuration of the configuration as illustrated in FIG. 16. The bit line leakage load circuit 160 is connected between the ground level and the power terminal VT provided for the leak test and serves to supply the electric power source only to the bit lines as selected on the test mode for the purpose of detecting the leakage current through the bit lines. More specifically speaking, as illustrated in FIG. 18, the bit line leakage load circuit 160 is composed of PMOS elements 160a and 160b, NMOS elements 160c and 160d and inverters 160e and 160f and controlled by the mode switching signal MD and the output signal of the column address decoder.

Also, the bit line pull-up circuits U3 and U4 and the data line equalizer element E2 constituting the data line pull-up & equalizer circuit 134 are made conductive or non-conductive in response to the signal φ2 output from the test mode switching control circuit 142, which has the same configuration as the test mode switching control circuit 141.

In accordance with the present embodiment, the bit line pull-up circuits U3 and U4 and the data line equalizer element E2 is made non-conductive by means of the test mode switching control circuit 142 while the test mode switching control circuit 141 serves to make non-conductive the bit line load circuits 111 and 112, the bit line equalizer element E1 and the bit line pull-up elements U1 and U2 which constitutes the bit line load & pull-up & equalizer circuit 110.

Also, the PMOS elements 160a and 160b and the NMOS elements 160c and 160d of the bit line leakage load circuit 160 is made conductive in accordance with the mode switching signal MD being at the "H" level on the test mode. Furthermore, only at the address as selected by the column switch, the inverters 160e and 160f connected to the corresponding bit line pair are activated so that the power source provided for the leak test is supplied to the bit lines. In this case, if the leakage current path exists, the electric current is passed through the power terminal VT provided for the leak test.

[Seventh Embodiment]

In the case of the fifth embodiment of the present invention as described above, the address signal output control circuit 150 has to be provided for each address buffer 133 in a one-to-one correspondence. The number of external signals to be given and the number of terminals to be provided within a chip are substantially increased so that the test device has to be provided with a larger number of terminals and the chip size tends to increase. In accordance with the present embodiment, the address output control signals ADDT are given through I/O terminals for the purpose of preventing both the number of terminals of the test device and the chip size from being increased.

Figure 19:
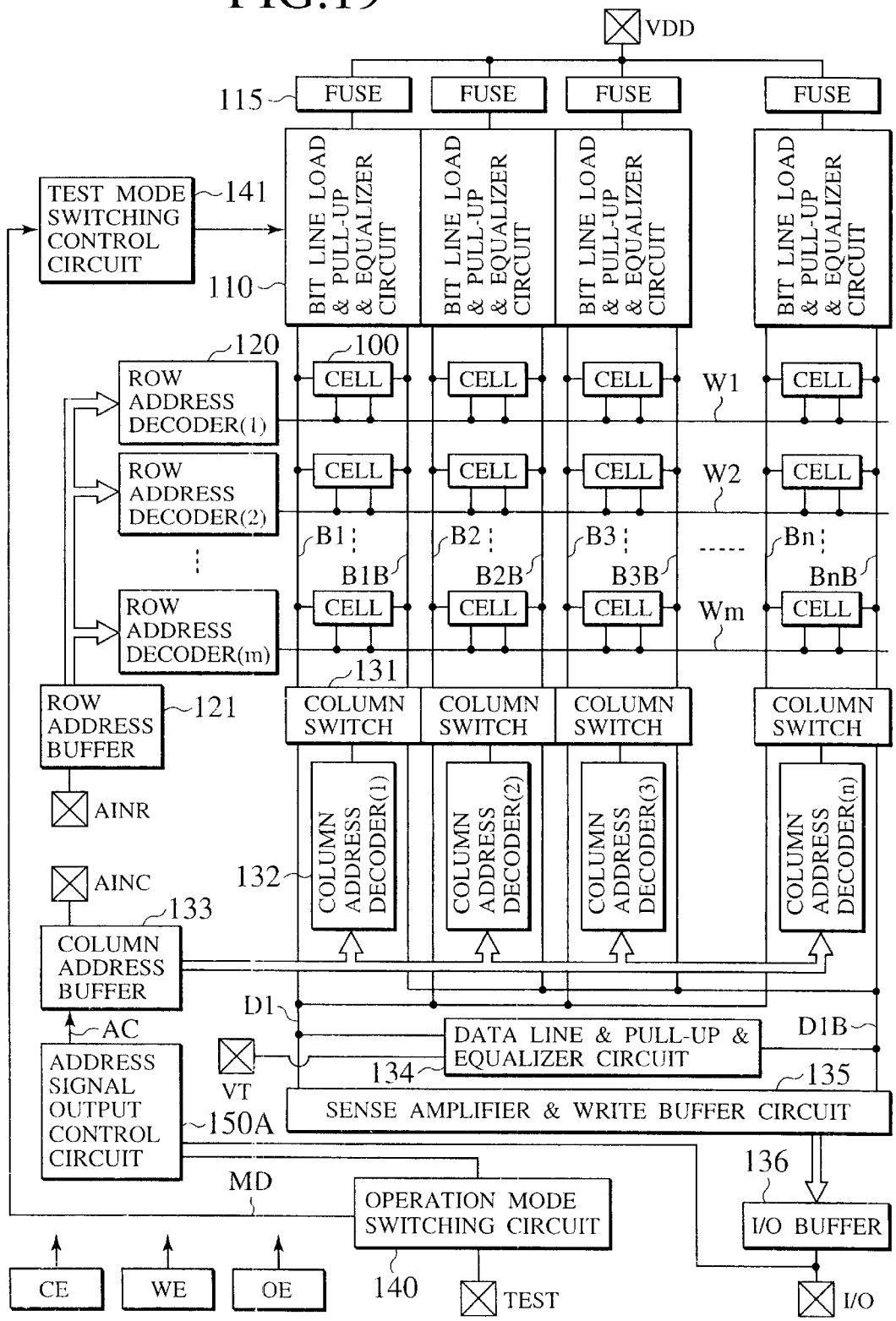
FIG. 19 is a block diagram showing the configuration of the semiconductor memory device in accordance with a seventh embodiment of the present invention.

FIG. 19 is a block diagram showing the configuration of the semiconductor memory device in accordance with the seventh embodiment of the present invention. In the figure, like references indicative of identical or functionally similar elements are given as illustrated in FIG. 15 and therefore redundant explanation is not repeated.

The configuration in accordance with the present embodiment is distinguished from the configuration as illustrated in FIG. 15 in that the address output control signals ADDT are given through existing I/O terminals without particular ADDT terminals which are additionally and separately provided for the purpose of giving external address output control signals ADDT. For this purpose, an address signal output control circuits 150A are provided with a different configuration than the address signal output control circuit 150. Namely, each address signal output control circuit 150A is designed with the same configuration as the address signal output control circuit illustrated in FIG. 12.

The I/O terminals are used to perform the read/write operation of user data in the normal operation. On the test mode, since the sense amplifier & write buffer circuit 135 are inactivated, the signals as externally given to the I/O terminals are input to the address signal output control circuit 150A as the address output control signal ADDT(1) to ADDT(3).

By this configuration, there is no longer need for the terminals ADDT as illustrated in FIG. 15 to minimize the increase in the chip size.

As described in the foregoing description, in accordance with the present invention, the increase in the chip size due to the test circuit is minimized, and in addition to this the location of a defective bit line and the location of a defective memory cell as a leakage current path can be easily detected for a short time. It is therefore possible to realize a semiconductor device which can be manufactured with a higher yield.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A semiconductor memory device comprising:
   a plurality of word lines each of which is connected to a predetermined number of memory cells in the row direction;
   a plurality of common electric power sources lines each of which is provided for each predetermined number of rows in order to make connection with the current paths of the memory cells on said each predetermined number of rows in a row direction;
   a plurality of row selection lines connected respectively to said respective word lines for selecting a row;
   row address decoders for selecting said row selection lines; and
   a selection circuit connected between said common electric power source lines and an electric power source respectively and capable of selecting a first group of said common electric power source lines in order to connect the common electric power source line as selected with the electric power source and disconnect the remaining common electric power source lines from the electric power source as a second group of said common electric power source lines in the case that switching to a test mode is indicated by an operation mode switching signal which is used to switch between a normal operation mode and a test mode, and for connecting all of said common electric power source lines with the electric power source in the case that the operation mode switching signal indicates switching to the normal operation mode;

wherein said selection circuit is capable of repeating said selection of said common electric power source line(s) between either group of the common electric power source lines having been previously selected until said any one of said common electric power source lines is finally selected in said test mode.

2. The semiconductor memory device as claimed in claim 1 wherein a fuse is provided between the electric power source and a respective one of said common electric power source lines.

3. A semiconductor memory device comprsing:

a memory cell array in which memory cells are arranged in the form of a matrix which is divided into a plurality of blocks;

a plurality of word lines provided within said memory cell array, each of said word lines being connected to a same number of memory cells in a row direction;

a word line selection circuit having input terminals connected to a row selection line for selecting a row and a block selection line for selecting a block for selecting a predetermined word line among from the plurality of said word lines;

a plurality of common electric power source lines each of which is provided for each predetermined number of rows in order to make connection with the current paths of the memory cells on said each predetermined number of rows in the row direction;

row address decoders for outputting a selection signal on the basis of a row addressing signal required for selecting said row selection lines;

a selection circuit connected between said common electric power source lines and an electric power source respectively and receiving an operation mode switching signal which is used to switch between a normal operation mode and a test mode and said selection signal as given from said row address decoders for selecting one of and capable of selecting a first group of said common electric power source lines by said selection signal in order to connect the common electric power source line as selected with the electric power source and disconnect the remaining common electric power source lines from the electric power source as a second group of said common electric power source lines in the case that switching to the test mode is indicated by said operation mode switching signal, and for connecting all of said common electric power source lines with the electric power source in the case that the operation mode switching signal indicates switching to the normal operation mode; and an address signal output control circuit for controlling the supply of a row addressing signal to said row address decoders on the basis of an address output control signal as externally given for determining a defective cell in the case that switching to the test mode is indicated by said operation mode switching signal;

an address signal output control circuit for controlling the supply of a row addressing signal to said row address decoders on the basis of an address output control signal as externally given for determining a defective cell in the case that switching to the test mode is indicated by said operation mode switching signal;

wherein said selection circuit is capable of repeating said selection of said common electric power source line(s) between either group of the common electric power source lines having been previously selected until said any one of said common electric power source lines is finally selected in said test mode.

4. The semiconductor memory device as claimed in claim 3 wherein the determination of a defective cell is performed by:

determining, as a region flowing a leakage current no smaller than a predetermined value, one of a first large region and a remaining second large region, either of said first and second large regions being selected by simultaneously selecting a predetermined number of said row selection lines;

determining, as a region flowing a leakage current no smaller than a predetermined value, one of a first small region and a remaining second small region, said first and second small regions constituting said one of the first and second large regions, either of said first and second small regions being selected by simultaneously selecting a predetermined number of said row selection lines, said address output control signal to be supplied to said address signal output control circuit is a control signal for selecting said row selection lines by controlling the output of said row addressing signal in order to perform the determination of a defective cell.

5. The semiconductor memory device as claimed in claim 3 or claim 4 wherein, while the number of said row address decoders is $2^n$ where n is an integer, said address signal output control circuit serves to select one of the $2^n$ row selection lines in the case that said the operation mode switching signal indicate switching to the normal operation mode and to select $2^n/2^m$ lines, (m=1, 2, ..., n), of the $2^n$ row selection lines in the case that said the operation mode switching signal indicate switching to the test operation mode.

6. The semiconductor memory device as claimed in claim 5 further comprising n address buffers each of which is provided with two output terminals for taking control of the output signal of the $2^n$ row address decoders, wherein n row addressing signals is input to the input terminal of said n address buffers, wherein said address signal output control circuit serves to output signals to one terminals of the output terminals of said n address buffers in the same phase as said row addressing signals and to output signals to the other terminals of the output terminals of said n address buffers in the opposite phase to said row addressing signals in the case that said the operation mode switching signal indicate switching to the normal operation mode, and serves to output signals to both the two output terminals of each of said n address buffers in the same phase as said row addressing signals in the case that said the operation mode switching signal indicate switching to the test operation mode.

7. The semiconductor memory device as claimed in either of claims 3 through 6 wherein said address output control signal is applied through existing I/O terminals which have provided for performing the read/write operation of user data.

8. The semiconductor memory device as claimed in either of claims 3 through 6 further comprising fuses provided between said common electric power source lines and the electric power source in order to separate a leakage current path when a defective cell is determined by the determination of a defective cell as recited.

9. The semiconductor memory device as claimed in claim 3 wherein the determination of a defective cell is performed by:
   determining, as a region flowing a leakage current no smaller than a predetermined value, one of a first large region and a remaining second large region, either of said first and second large regions being selected by simultaneously selecting a predetermined number of said column selection lines;
   determining, as a region flowing a leakage current no smaller than a predetermined value, one of a first small region and a remaining second small region, said first and second small regions constituting said one of the first and second large regions, either of said first and second small regions being selected by simultaneously selecting a predetermined number of said column selection lines,
   said address signal output control circuit serves to take control of said column address signal for selecting said column selection line in order to perform the determination of a defective bit line.

10. The semiconductor memory device as claimed in claim 9 wherein, while the number of said column address decoders is $2^n$ for outputting signals though $2^n$ column selection lines where n is an integer,
   said address signal output control circuit serves to select one of the $2^n$ column selection lines in the case that said the operation mode switching signal indicate switching to the normal operation mode and to select $2^n/2^m$ lines, (m=1, 2, ..., n), of the $2^n$ column selection lines in the case that said the operation mode switching signal indicate switching to the test operation mode.

11. The semiconductor memory device as claimed in claim 10 further comprising n address buffers each of which is provided with two output terminals for taking control of the output signal of the $2^n$ column address decoders, wherein n column addressing signals is input to the input terminal of said n address buffers,
   wherein said address signal output control circuit serves to output signals to one terminals of the output terminals of said n address buffers in the same phase as said column addressing signals and to output signals to the other terminals of the output terminals of said n address buffers in the opposite phase to said column addressing signals in the case that said the operation mode switching signal indicate switching to the normal operation mode, and serves to output signals to both the two output terminals of each of said n address buffers in the same phase as said column addressing signals in the case that said the operation mode switching signal indicate switching to the test operation mode.

12. The semiconductor memory device as claimed in either of claims 9 through 11 wherein said address output control signal is applied through existing I/O terminals which have provided for performing the read/write operation of user data.

13. The semiconductor memory device as claimed in either of claims 9 through 11 further comprising fuses provided between said bit lines and the common electric power source line connected to ends of those bit lines in order to break a leakage current path when a defective bit line is determined by the determination of a defective bit line as recited.

14. A semiconductor memory device comprising:
   a memory cell array in which memory cells are arranged in the form of a matrix;
   a plurality of bit lines arranged within said memory cell array in the column direction of said memory cell, each of said bit lines being connected to one ends of the data transfer gates of said memory cell respectively;
   column address decoders for outputting a column selection signal to the column selection line on the basis of a column address signal;
   a column selection switch for selecting a desired bit line among from the plurality of said bit lines on the basis of said column selection signal;
   a plurality of data lines connected to the plurality of said bit lines through said column selection switch;
   a test mode switching control circuit for cutting off the electric power supply through power source lines connected to one ends of said bit line and through power source lines connected to a data lines in the case that switching to a test mode is indicated by an operation mode switching signal which is used to switch between a normal operation mode and the test mode;
   a power terminal provided for leak test through which an electric power source for test it supplied;
   a bit line leakage load circuit provided between the power source provided for test and a ground and serves to supply said electric power source only to the bit lines as selected by means of said column selection switch on the test mode for detecting the leakage current through the bit lines; and
   a selection circuit connected between said power source lines and an electric power source respectively and capable of selecting a first group of power source lines in order to connect the power source line as selected with the electric power source and disconnect the remaining power source lines from the electric power source as a second group of the power source lines, and for connecting all of the power source lines with the electric power source in the case that the operation mode switching signal indicates switching to the normal operation mode;
   wherein said selection circuit is capable of repeating said selection of said power source line(s) between either group of the electric power source lines having been previously selected until said any one of said power source lines is finally selected in said test mode.

15. The semiconductor memory device as claimed in claim 14 further comprising an address signal output control circuit that serves to take control of the column address signal to be supplied to said column address decoders on the basis of an address output control signal as externally given in order to perform the determination of a defective bit line in the case that the operation mode switching signal indicate switching to the test mode.

* * * * *